United States Patent
Hongou

(10) Patent No.: US 8,669,797 B2
(45) Date of Patent: Mar. 11, 2014

(54) PHASE LOCKED LOOP AND PHASE COMPARISON METHOD

(71) Applicant: Fujitsu Limited, Kawasaki (JP)

(72) Inventor: Hironobu Hongou, Sendai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/774,424

(22) Filed: Feb. 22, 2013

(65) Prior Publication Data

US 2013/0241607 A1  Sep. 19, 2013

(30) Foreign Application Priority Data

Mar. 19, 2012 (JP) ................. 2012-061915

(51) Int. Cl.
    *H03L 7/06* (2006.01)
(52) U.S. Cl.
    USPC .......................................... 327/156; 327/147
(58) Field of Classification Search
    USPC ................................................. 327/147, 156
    See application file for complete search history.

(56) References Cited

U.S. PATENT DOCUMENTS

| | | | |
|---|---|---|---|
| 8,222,933 B2* | 7/2012 | Nagaraj .................. | 327/147 |
| 2005/0001673 A1* | 1/2005 | Regev ...................... | 329/315 |
| 2006/0203939 A1* | 9/2006 | Chou et al. .............. | 375/319 |
| 2008/0043893 A1* | 2/2008 | Nagaraj et al. ......... | 375/376 |
| 2011/0221487 A1* | 9/2011 | Lesso ...................... | 327/147 |
| 2011/0242915 A1* | 10/2011 | Ma ........................... | 365/194 |
| 2011/0248753 A1* | 10/2011 | Leistner ................. | 327/156 |
| 2011/0273210 A1* | 11/2011 | Nagaraj ................... | 327/159 |
| 2012/0223753 A1* | 9/2012 | Moore ..................... | 327/157 |

FOREIGN PATENT DOCUMENTS

JP         9-51267         2/1997

* cited by examiner

*Primary Examiner* — Adam Houston
(74) *Attorney, Agent, or Firm* — Fujitsu Patent Center

(57) ABSTRACT

In a phase locked loop, a first frequency divider divides the frequency of an input signal. A low-pass filter receives a frequency-divided signal output from the first frequency divider and having an average phase difference calculated by a calculation unit, cuts off high-frequency components of the received signal, and outputs a resultant signal. A voltage controlled oscillator varies the frequency of a signal to be output based on the signal output from the low-pass filter. A second frequency divider divides the frequency of the signal output from the voltage controlled oscillator. The calculation unit calculates a phase difference between signals individually output from the first frequency divider and the second frequency divider for each phase in one cycle of the signal output from the first frequency divider, and calculates an average phase difference based on the calculated phase differences.

5 Claims, 32 Drawing Sheets

PHASE LOCKED LOOP AND PHASE COMPARISON METHOD

CROSS-REFERENCE TO RELATED APPLICATION

This application is based upon and claims the benefit of priority of the prior Japanese Patent Application No. 2012-061915, filed on Mar. 19, 2012, the entire contents of which are incorporated herein by reference.

FIELD

The embodiments discussed herein are related to a phase locked loop and a phase comparison method.

BACKGROUND

General phase locked loops (PLL) are designed on the assumption that a signal comprising a stream of evenly spaced pulses is input thereto. Therefore, a frequency-divided signal of such an input signal also has a regular pulse-to-pulse interval.

On the other hand, some PLLs receive, as an input signal, a signal with gaps in the sequence of pulses. Such a PLL outputs, for example, pulses with the same wavenumber as that of the pulses of the input signal with gaps, at equally-spaced phase intervals. The PLL is configured to set, for example, its loop bandwidth low to thereby filter out the effect of phase jumps due to the pulse gaps of the input signal, and then output pulses with the same wavenumber as that of the input pulses at equally-spaced phase intervals.

Note that some conventional PLLs having been proposed prevent malfunction due to interruption of a reference clock (see, for example, Japanese Laid-open Patent Publication No. 09-51267).

However, the conventional PLLs employ the method of reducing the loop bandwidth, which leaves a problem of poor tracking performance (response) of the output signal to changes in the input signal.

SUMMARY

According to one aspect, there is provided a phase locked loop for generating an output signal whose wavenumber matches a wavenumber of a signal with gaps, input thereto. The phase locked loop includes a first frequency divider configured to divide the frequency of the input signal; a second frequency divider configured to divide the frequency of the output signal; and a calculation unit configured to calculate a phase difference between a signal output from the first frequency divider and a signal output from the second frequency divider in one cycle of the output signal of the first frequency divider, and then calculate an average phase difference based on calculated phase differences.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
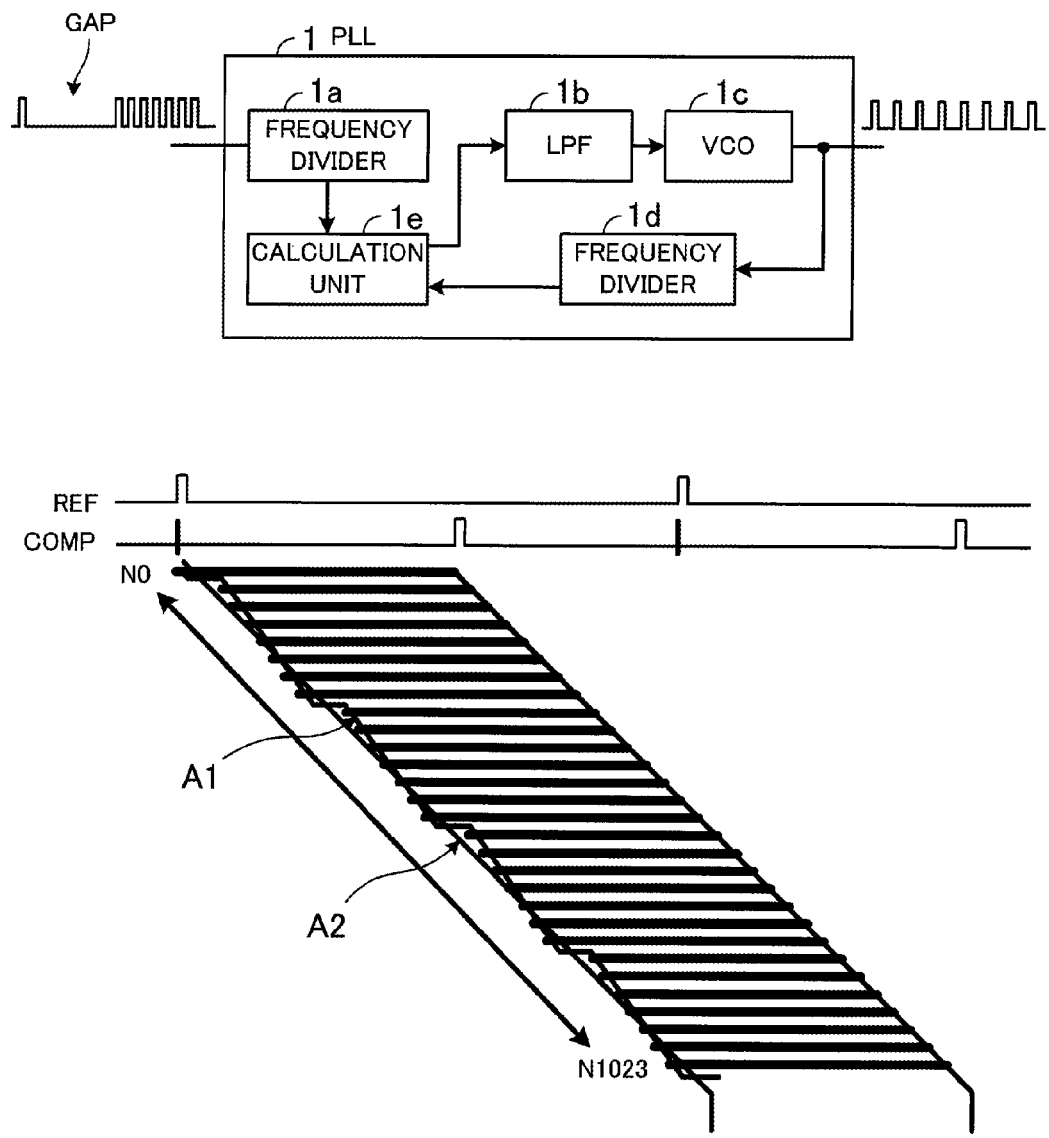
FIG. 1 illustrates a PLL according to a first embodiment.

Several embodiments will be described below with reference to the accompanying drawings, wherein like reference numerals refer to like elements throughout.

(a) First Embodiment

FIG. 1 illustrates a PLL according to a first embodiment. A PLL 1 includes frequency dividers 1a and 1d, a low-pass filter (LPF) 1b, a voltage controlled oscillator (VCO) 1c, and a calculation unit 1e, as illustrate in FIG. 1.

To the left-hand side of the PLL 1 in FIG. 1, a signal with gaps in the sequence of pulses, input to the PLL 1 is represented. To the right-hand side of the PLL 1, a signal output from the PLL 1 is represented. The PLL 1 generates the output signal in such a manner that the wavenumber of the output signal matches that of the input signal. On the lower side of the PLL 1, signals and the like to illustrate operations of the PLL 1 are depicted.

To the frequency divider 1a, the signal with gaps is input. The frequency divider 1a divides the frequency of the input signal. "REF" of FIG. 1 represents a signal obtained by the frequency divider 1a dividing the frequency of the input signal. To the LPF 1b, a signal having an average phase difference calculated by the calculation unit 1e (to be described later) is input. The LPF 1b cuts off high-frequency components of the input signal and then outputs the resultant signal.

The VCO 1c varies the frequency of the signal to be output based on the signal output from the LPF 1b. The frequency divider 1d divides the frequency of the signal output from the VCO 1c. "COMP" of FIG. 1 represents a signal output from the frequency divider 1d. The calculation unit 1e calculates a phase difference between a signal output from the frequency divider 1a and the signal output from the frequency divider 1d for each of at least one or more phases in one cycle of the signal output from the frequency divider 1a, and then calculates an average phase difference based on the calculated one or more phase differences.

For example, the calculation unit 1e calculates a phase difference between the signal REF output from the frequency divider 1a and the signal COMP output from the frequency divider 1d for each of at least one or more of phases N0 to N1023 in one cycle of the signal REF, as illustrated on the lower side of the PLL 1 in FIG. 1, and then calculates an average of the phase differences based on the calculated one or more phase differences.

The signal input to the frequency divider 1a has gaps. Therefore, phases of the signal REF output from the frequency divider 1a change in a saw-tooth pattern, as indicated by an arrow A1 of FIG. 1, compared to the signal COMP. The calculation unit 1e calculates an average of the saw-tooth phase changes, as indicated by an arrow A2. The calculation unit 1e, for example, subtracts the calculated average phase change from the phase difference in phase N0 to thereby obtain a resultant phase difference, and outputs the signal REF having the resultant phase difference to the LPF 1b.

Here, the case is considered in which the phase differences between the signal output from the frequency divider 1a and the signal output from the frequency divider 1d are output to the LPF 1b. In this case, a signal input to the LPF 1b has saw-tooth phase changes, as indicated by the arrow A1. In particular, in each of phases where a large change is observed in the saw-tooth phase changes, the frequency of the signal output from the VCO 1c also changes significantly. In order to control the frequency changes, a cutoff frequency of the LPF 1b needs to be reduced. However, a reduction in the cutoff frequency of the LPF 1b causes the PLL 1 to exhibit poor tracking performance of the output signal to the input signal.

On the other hand, according to the PLL 1 of FIG. 1, the calculation unit 1e calculates an average phase change of the signal REF, as indicated by the arrow A2. Therefore, the signal REF input to the LPF 1b is free from the effect of the saw-tooth phase changes, which eliminates the necessity of reducing the cutoff frequency of the LPF 1b. This improves the PLL 1 in tracking performance of the output signal to the input signal.

As described above, the calculation unit 1e of the PLL 1 calculates a phase difference between the signal output from the frequency divider 1a and the signal output from the frequency divider 1d for each of at least one or more phases in one cycle of the signal output from the frequency divider 1a, and then calculates an average of the phase differences based on the calculated one or more phase differences. With this, the PLL 1 exhibits improved tracking performance of the output signal to the input signal.

(b) Second Embodiment

Figure 2:
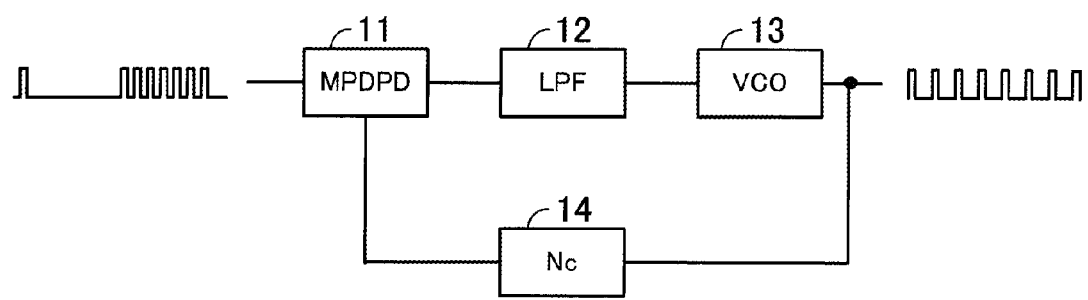
FIG. 2 illustrates a PLL according to a second embodiment.

Next, a second embodiment is described in detail with reference to the accompanying drawings. FIG. 2 illustrates a PLL according to the second embodiment. The PLL includes a multi-phase digital phase detector (multi-phase DPD, or MPDPD in FIG. 2) 11, a LPF 12, a VCO 13, and a comparison frequency divider (Nc in FIG. 2) 14, as illustrated in FIG. 2. A signal with gaps in the sequence of pulses (represented on the left-hand side of the multi-phase DPD 11 in FIG. 2) is input to the PLL. The PLL outputs pulses (represented on the right-hand side of the VCO 13 in FIG. 2) with the same wavenumber as that of the pulses of the input signal, at equally-spaced phase intervals. The multi-phase DPD 11 corresponds to, for example, a combination of the frequency divider 1a and the calculation unit 1e of FIG. 1.

To the multi-phase DPD 11, the signal with gaps is input. Although the details are described later, the multi-phase DPD 11 calculates an average of phase differences between a reference frequency-divided signal obtained by dividing the frequency of the signal input thereto and a comparison frequency-divided signal output from the comparison frequency divider 14. More specifically, the multi-phase DPD 11 calculates multiple phase differences (for example, 1024 phase differences) between the reference frequency-divided signal and the comparison frequency-divided signal in one cycle of the reference frequency-divided signal, and then calculates an average of the phase differences. With this, a signal output from the multi-phase DPD 11 is free from the effect of phase jumps due to the gaps in the input signal.

The LPF 12 cuts off low-frequency components of the signal output from the multi-phase DPD 11. As described above, the signal output from the multi-phase DPD 11 is free from the effect of phase jumps. Therefore, there is no need to set the loop bandwidth of the LPF 12 low in order to filter out the effect of phase jumps. With this, the PLL of FIG. 2 exhibits improved tracking performance of the output signal to changes in the input signal. The VCO 13 varies the oscillation frequency of the signal to be output according to voltage output from the LPF 12. The voltage output from the LPF 12 may be represented by a digital value (binary number). The comparison frequency divider 14 outputs the signal output from the VCO 13 to the multi-phase DPD 11.

The PLL of FIG. 2 is installed in, for example, an optical signal processor and used for controlling signal transfer. A conventional PLL (i.e. a PLL without the multi-phase DPD 11) and DPD are described next prior to a detailed description of the multi-phase DPD 11 of FIG. 2.

Figure 3:
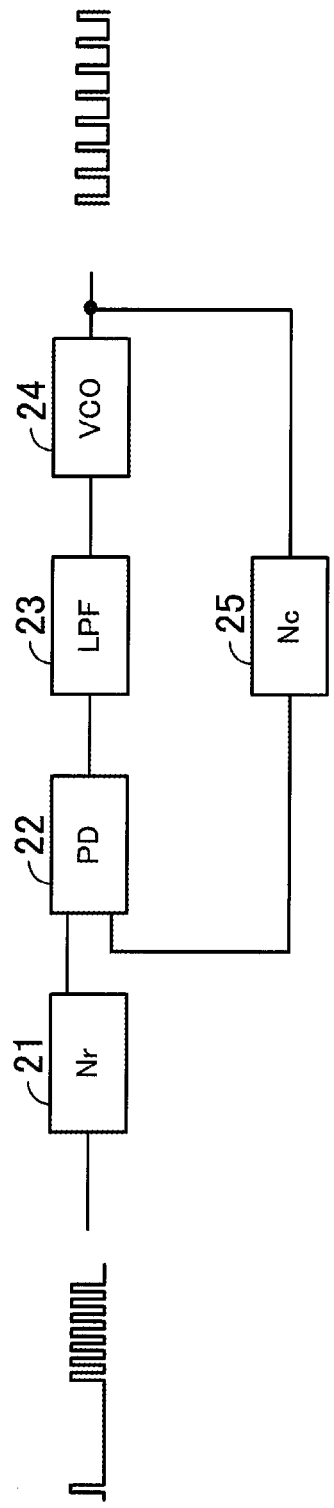
FIG. 3 illustrates a conventional PLL.

FIG. 3 illustrates a conventional PLL. The PLL of FIG. 3 includes a reference frequency divider (Nr in FIG. 3) 21, a phase detector (PD) 22, an LPF 23, a VCO 24, and a comparison frequency divider (Nc) 25.

To the reference frequency divider 21, a signal with gaps in the sequence of pulses is input. The reference frequency divider 21 divides the frequency of the input signal. The phase detector 22 compares phases of a signal output from the reference frequency divider 21 and a signal output from the comparison frequency divider 25, to thereby obtain a phase difference. The phase detector 22 outputs voltage representing the phase difference. The LPF 23 cuts off low-frequency components of the signal output from the phase detector 22. The VCO varies the oscillation frequency of a signal to be output according to voltage output from the LPF 23. The voltage output from the LPF 23 may be represented by a digital value (binary number). The comparison frequency divider 25 outputs the signal output from the VCO 24 to the phase detector 22.

Figure 4:
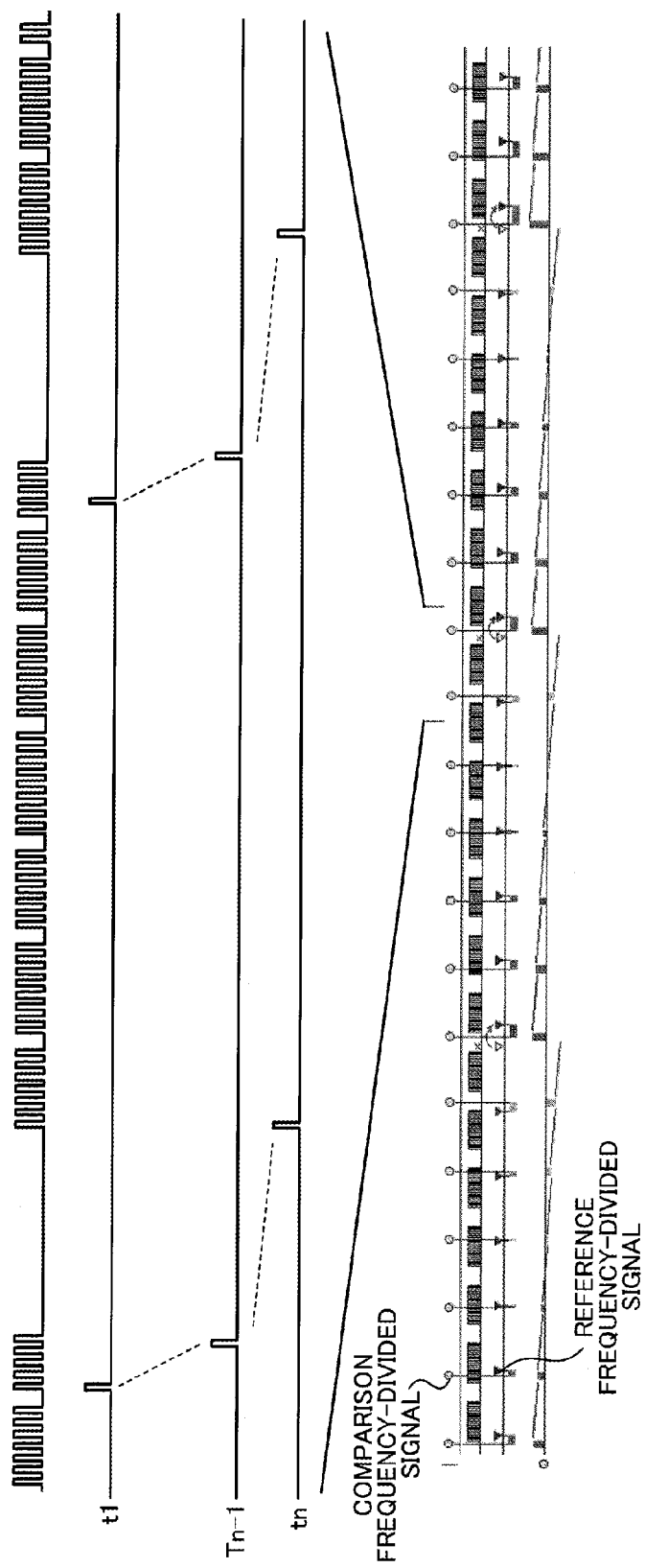
FIG. 4 illustrates signal pulses input to a reference frequency divider and signal pulses output from the reference frequency divider.

FIG. 4 illustrates signal pulses input to a reference frequency divider and signal pulses output from the reference frequency divider. A pulse signal at the top of FIG. 4 represents a signal input to the reference frequency divider 21. The input signal has gaps in the sequence of pulses, as illustrated in FIG. 4. The reference frequency divider 21 divides the frequency of the input signal to generate a frequency-divided signal, and outputs the frequency-divided signal to the phase detector 22.

A waveform t1 of FIG. 4 represents signal pulses output from the reference frequency divider 21 at a time point t1. Similarly, a waveform tn-1 represents signal pulses output from the reference frequency divider 21 at a time point tn-1. A waveform tn represents signal pulses output from the reference frequency divider 21 at a time point tn.

The signal input to the reference frequency divider 21 is, for example, a signal to be processed by an optical signal processor for signal transfer control. The signal input to the reference frequency divider 21 has gaps, some of which are large. Two large gaps are depicted in the signal at the top of FIG. 4. Each of the gaps corresponds to, for example, a tail and a header of a data signal transmitted by the optical signal processor.

The signal input to the reference frequency divider 21 has gaps, as illustrated in FIG. 4. Therefore, phase shifts occur in the frequency-divided signal output from the reference frequency divider 21 at some points in time. In particular, phase jumps occur at the large gaps. In the example of FIG. 4, a phase jump occurs from the time point tn-1 to the time point tn.

Note that a square wave signal illustrated at the bottom of FIG. 4 represents the signal input to the reference frequency divider 21. The first four waveforms of FIG. 4 from the top provide an enlarged view of the square wave signal at the bottom. In addition, each circle of FIG. 4 in the square wave signal indicates a phase reference point of a comparison frequency-divided signal (the signal output from the comparison frequency divider 25), and each inverted triangle indicates a phase reference point of a reference frequency-divided signal (the signal output from the reference frequency divider 21). The reference frequency-divided signal goes out of phase with the comparison frequency-divided signal because of the gaps in the input signal, as illustrated in FIG. 4.

Figure 5:
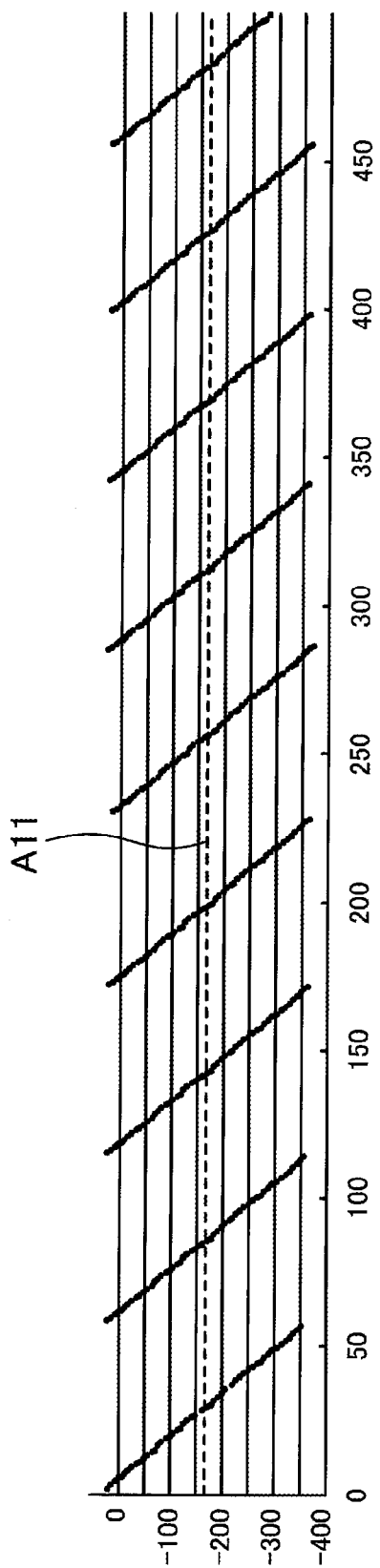
FIG. 5 illustrates changes in phase difference between a signal output from the reference frequency divider and a signal output from a comparison frequency divider.

FIG. 5 illustrates changes in phase difference between a signal output from a reference frequency divider and a signal output from a comparison frequency divider. The horizontal axis of FIG. 5 represents the time, and the vertical axis represents the phase difference between the two signals.

The signal input to the reference frequency divider 21 has gaps, as illustrated in FIG. 4. Therefore, the phase difference between the signal output from the reference frequency divider 21 and the signal output from the comparison frequency divider 25 changes linearly, as illustrated in FIG. 5.

In addition, large gaps in the signal input to the reference frequency divider 21 cause phase jumps. As a result, phase jumps also occur in the phase difference between the signals output from the reference frequency divider 21 and the comparison frequency divider 25. For example, the phase difference makes a sudden change from a negative value to a positive value at some points in the time course in FIG. 5. Such a change occurs due to, for example, a phase jump from the time point to-1 to the time point to illustrated in FIG. 4.

The conventional PLL of FIG. 3 filters out the effect of phase jumps due to the gaps in the input signal, for example, by setting the loop bandwidth low. The PLL of FIG. 3 is configured to set, for example, a signal pass band of the LPF 23 low, to thereby limit the effect of phase jumps. This allows the VCO 24 to output pulses with the same wavenumber as that of the pulses of the input signal at equally-spaced phase intervals.

However, setting the loop bandwidth of the PLL low results in poor tracking performance of the output signal to changes in the input signal. For example, even if the frequency of the input signal changes, the frequency of the output signal does not change immediately in response to the change of the input signal, thus the output signal exhibiting poor tracking performance.

The conventional PLL of FIG. 3 may be used, for example, in an optical signal processor for controlling signal transfer, as in the case of the PLL of FIG. 2. In this case, the poor tracking performance of the PLL leads to the need of a large buffer capacity in order to compensate for signal variations, which increases costs as well as the power consumption.

Figure 6:
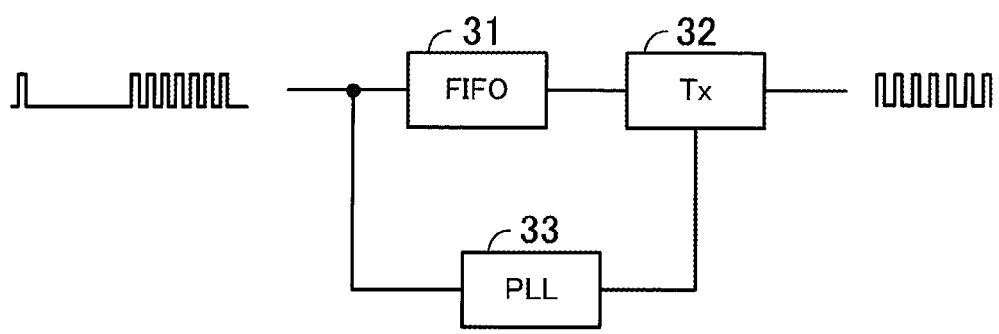
FIG. 6 illustrates an optical signal processor with a PLL installed.

FIG. 6 illustrates an optical signal processor with a PLL installed. The optical signal processor includes a First-in First-out (FIFO) memory 31, a transmitter (Tx in FIG. 6) 32, and a PLL 33, as illustrated in FIG. 6. The PLL 33 corresponds to the conventional PLL of FIG. 3.

To the FIFO memory 31, a signal input to the PLL 33, that is, a signal used for controlling signal transfer is input. The FIFO memory 31 holds the signal input in a FIFO manner and outputs the signal to the transmitter 32. The transmitter 32 outputs the signal held by the FIFO memory 31 in synchronization with a signal (pulses) output from the PLL 33.

As described above, setting the loop bandwidth of the PLL 33 low leads to poor signal tracking performance. Therefore, when the frequency of the input signal fluctuates, for example, the input signal needs to be held by the FIFO memory 31 until the frequency of the input signal converges.

In particular, the PLL 33 needs to have a sufficiently low loop bandwidth in order to filter out the effect of phase jumps due to large gaps in the input signal and, therefore, exhibits poor tracking performance. The poor tracking performance creates the need for providing the FIFO memory 31 with a large capacity, which in turn leads to high production costs and high power consumption.

Figure 7:
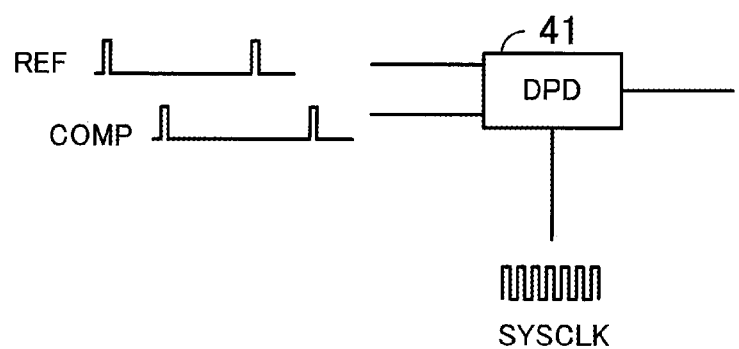
FIG. 7 illustrates a DPD.

Next described is the DPD. FIG. 7 illustrates a DPD. To a DPD 41 of FIG. 7, a reference frequency-divided signal REF and a comparison frequency-divided signal COMP are input. For example, the reference frequency-divided signal REF of FIG. 7 corresponds to the signal output from the reference frequency divider 21 of FIG. 3, and the comparison frequency-divided signal COMP of FIG. 7 corresponds to the signal output from the comparison frequency divider 25. In addition, a system clock SYSCLK is also input to the DPD 41.

Figure 8:
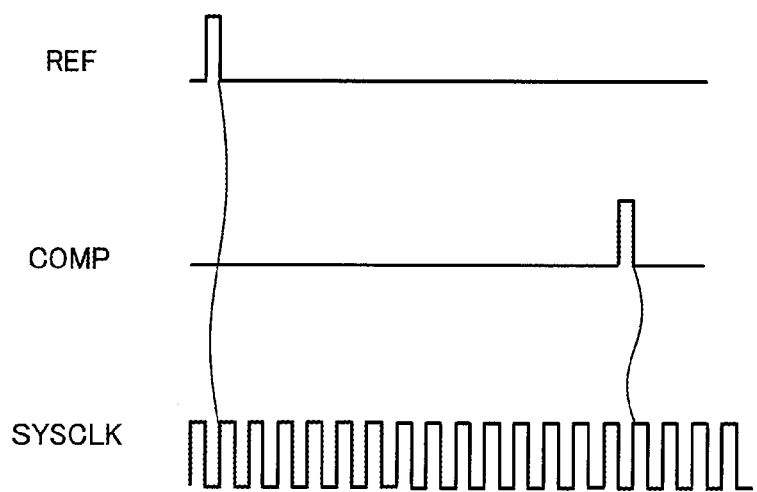
FIG. 8 illustrates operations of the DPD.

FIG. 8 illustrates operations of a DPD. Depicted in FIG. 8 are the reference frequency-divided signal REF, the comparison frequency-divided signal COMP, and the system clock SYSCLK, all of which are input to the DPD 41.

The DPD 41 outputs a digital count representing a phase difference between the reference frequency-divided signal REF and the comparison frequency-divided signal COMP. For example, the DPD 41 counts the system clock SYSCLK from a falling edge of the reference frequency-divided signal REF to a subsequent falling edge of the comparison frequency-divided signal COMP, as illustrated in FIG. 8. Thus, a phase difference of the reference frequency-divided signal REF and the comparison frequency-divided signal COMP is represented by a count value of the system clock SYSCLK obtained in this manner.

Next described is the multi-phase DPD 11. The DPD 41 of FIG. 7 measures the phase difference between the reference frequency-divided signal REF and the comparison frequency-divided signal COMP only once in each cycle of the reference frequency-divided signal REF. On the other hand, the multi-phase DPD 11 measures the phase difference multiple times in each cycle of the reference frequency-divided signal REF, and then calculates an average of the phase difference measurements between the reference frequency-divided signal REF and the comparison frequency-divided signal COMP. The multi-phase DPD 11 obtains by calculation, for example, a dotted line A11 of FIG. 5. Note that the conventional PLL of FIG. 3 filters out the effect of phase jumps using the LPF 23 to smoothen the saw-tooth waves of FIG. 5.

The multi-phase DPD 11 operates based on the following principles.

1) Rising edges of the reference frequency-divided signal are used as reference points.

2) A frequency division number of a reference frequency divider is divided into equally-spaced wavenumber intervals. For example, a frequency division number of the signal input to the multi-phase DPD 11 of FIG. 2 is divided into 1024 equally-spaced wavenumber intervals.

3) Each measurement of the phase difference is started at one of interval boundary points of the equally-spaced wavenumber intervals, and such a measurement is repeated until, for example, 1024 measurements of the phase difference are carried out.

4) When the number of measurements reaches the divided frequency division number (for example, 1024), a phase difference calculation (i.e. calculation of an average of the phase difference measurements) is made based on the measurements of the phase difference.

5) Rising edges of the comparison frequency-divided signal COMP at each of which a measurement (counting) of the phase difference is ended are generated by dividing a count value of the system clock SYSCLK in one phase comparison cycle (to be described later) into 1024 equally-spaced time intervals.

Figure 9:
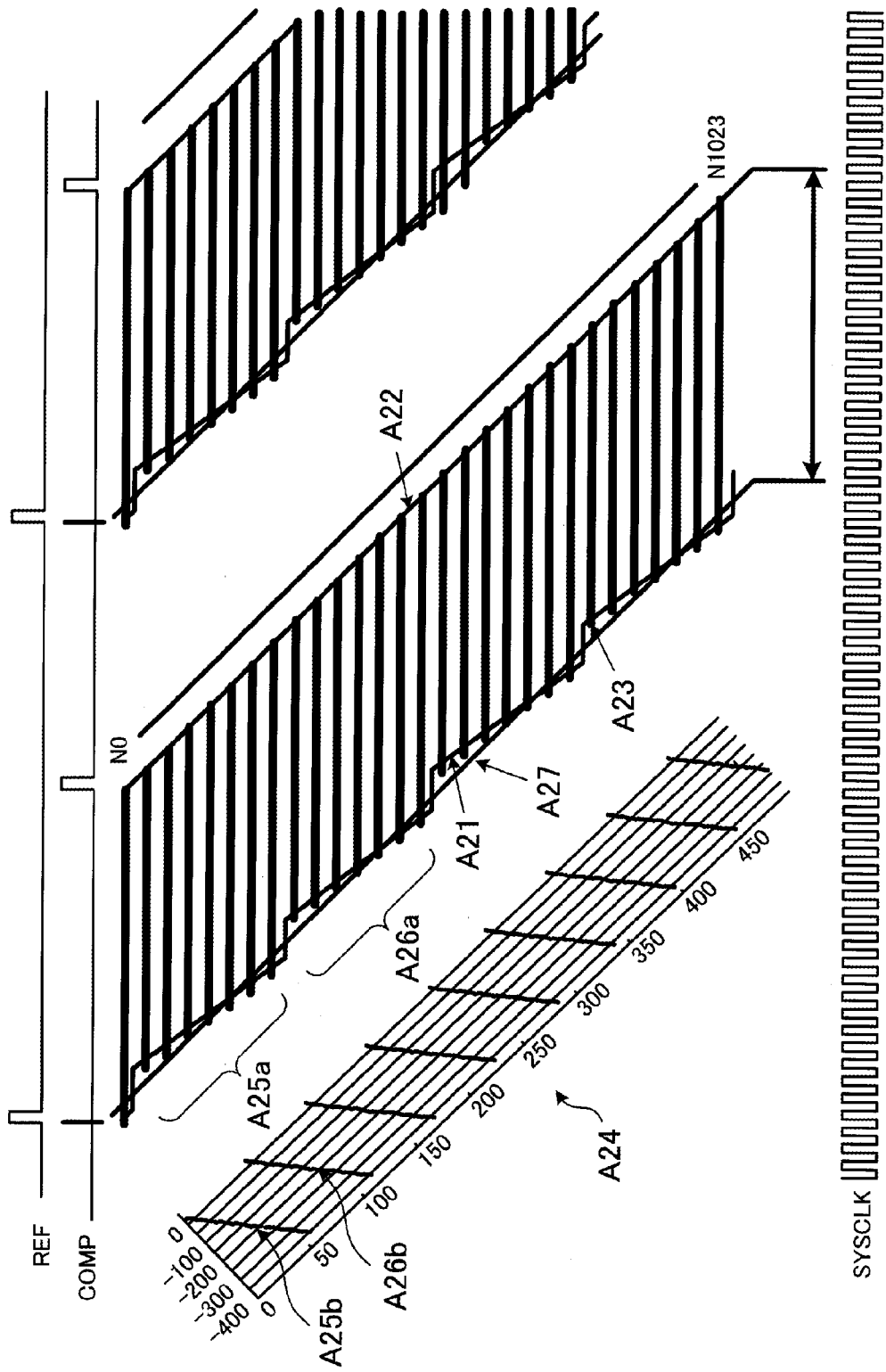
FIG. 9 illustrates operations of a multi-phase DPD.

FIG. 9 illustrates operations of a multi-phase DPD. The multi-phase DPD 11 divides the frequency of an input signal with gaps. "REF" of FIG. 9 represents the signal obtained by dividing the frequency of the signal input to the multi-phase DPD 11 (i.e. the reference frequency-divided signal REF). The reference frequency-divided signal REF of FIG. 9 corresponds to, for example, the waveforms t1, . . . , tn-1, and to of FIG. 4. "COMP" of FIG. 9 represents the signal output from the comparison frequency divider 14 (i.e. the comparison frequency-divided signal COMP).

The multi-phase DPD 11 divides a frequency division number of the reference frequency-divided signal REF into 1024 equally-spaced wavenumber intervals. For example, the multi-phase DPD 11 divides a frequency division number obtained between a rising edge and a subsequent rising edge of the reference frequency-divided signal REF of FIG. 9 into 1024 equally-spaced wavenumber intervals. More specifically, the multi-phase DPD 11 divides the frequency division number obtained between the rising edge and the subsequent rising edge of the reference frequency-divided signal REF into phases N0 to N1023 of equally-spaced wavenumber intervals of FIG. 9. A time period from a rising edge to a subsequent rising edge of the reference frequency-divided signal REF may be referred to hereinafter as the "phase comparison cycle".

The multi-phase DPD 11 counts (measures) the phase difference of the reference frequency-divided signal REF of FIG. 9 in each of phases N0 to N1023, which are obtained by dividing the frequency division number of the reference frequency-divided signal REF into equally-spaced wavenumber intervals. The phase difference counting is achieved by counting the system clock SYSCLK.

Phase shifts occur in the reference frequency-divided signal REF of FIG. 9 because the signal input to the multi-phase DPD 11 has gaps. Therefore, start points of the phase difference counting exhibit a saw-tooth pattern, as indicated by an arrow A21 of FIG. 9. On the other hand, end points of the phase difference counting exhibit a linear (straight line) pattern, as indicated by an arrow A22 of FIG. 9, because the comparison frequency-divided signal COMP of FIG. 9 based on which each phase difference measurement is ended is a signal generated by feeding back an output signal controlled by the VCO 13.

Among the start points of the phase difference counting, start points individually corresponding to large gaps in the input signal are largely shifted. A start point indicated by an arrow A23, for example, corresponds to a phase jump of the reference frequency-divided signal REF of FIG. 9.

A graph indicated by an arrow A24 of FIG. 9 illustrates phase changes of the reference frequency-divided signal REF. Count values indicated by A25a of FIG. 9 correspond to phase difference count values of the reference frequency-divided signal REF indicated by an arrow A25b, and a count value indicated by A26a corresponds to phase difference count values of the reference frequency-divided signal REF indicated by an arrow A26b.

The multi-phase DPD 11 obtains a center value of the saw-tooth phase difference indicated by the arrow A21 by averaging the phase difference count values of the 1024 phases, N0 to N1023. The multi-phase DPD 11 obtains an average value indicated by an arrow A27 of FIG. 9.

The multi-phase DPD 11 obtains an average phase shift of the reference frequency-divided signal REF against the comparison frequency-divided signal COMP by subtracting the calculated average count value from the count value in phase N0. The calculated average phase shift may be referred to hereinafter as the "average DPD count value". The average DPD count value calculated by the multi-phase DPD 11 corresponds to, for example, the average phase difference indicated by the dotted line A11 of FIG. 5.

Note that the DPD 41 of FIG. 7 obtains a count value of only one phase compared to the multi-phase DPD 11 which obtains count values of 1024 phases. The DPD 41 obtains the count value of, for example, phase N0 only. Therefore, count values obtained by the DPD 41 vary significantly due to phase shifts or phase jumps in the reference signal REF.

As described above, the multi-phase DPD 11 calculates an average DPD count value for each phase comparison cycle, and the output signal of the multi-phase DPD 11 has therefore not a saw-tooth pattern but a straight-line pattern. Therefore, in the PLL of FIG. 2, there is no need to set the signal pass band of the LPF 12 low. In other words, in the PLL of FIG. 2, there is no need to set the loop bandwidth unnecessarily low in order to smoothen the saw-tooth waves, and the PLL of FIG. 2 therefore provides improved tracking performance of the output signal to changes in the input signal.

In the case where the PLL of FIG. 2 is installed in, for example, the optical signal processor of FIG. 6, the improved tracking performance of the output signal to the input signal allows the capacity of the FIFO memory 31 to be reduced, which in turn lowers costs and contributes to power consumption reductions. In addition, since filtering out the effect of gaps in the input signal, the PLL of FIG. 2 produces a stable output signal.

(c) Third Embodiment

Next, a third embodiment is described in detail with reference to the accompanying drawing. The multi-phase DPD of the second embodiment needs multiple counters for the phase difference counting. According to the case of FIG. 9, for example, at least 1024 counters are needed in order to count the phase difference in each of phases N0 to N1023. On the other hand, the third embodiment uses fewer counters than 1024 to calculate the average phase difference.

A PLL according to the third embodiment is identical to the PLL of FIG. 2. Note however that functions of the multi-phase DPD 11 of the third embodiment differ from those of the second embodiment. The multi-phase DPD 11 of the third embodiment is described next.

Figure 10:
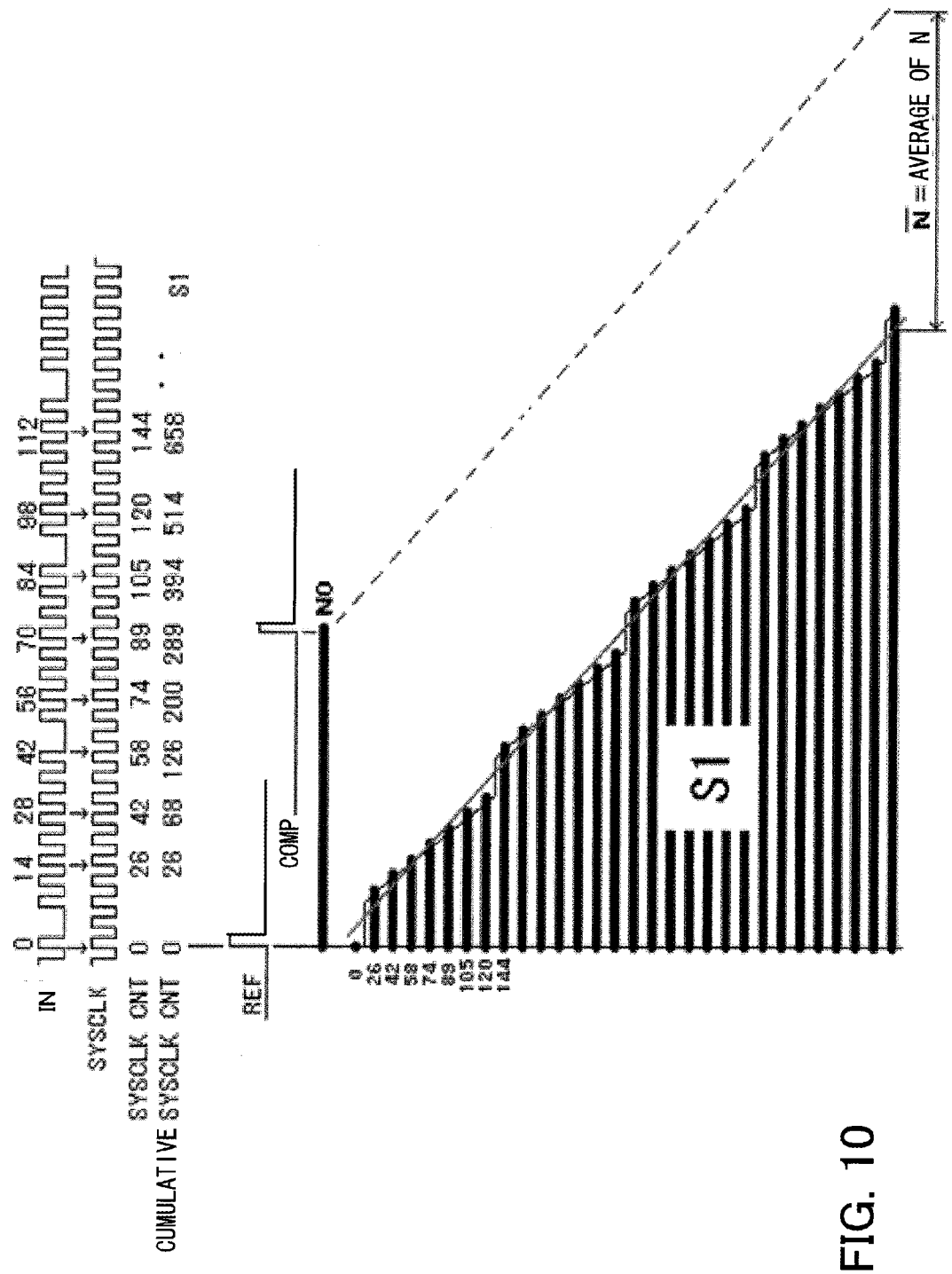
FIG. 10 is a first diagram illustrating a multi-phase DPD according to a third embodiment.

FIG. 10 is a first diagram illustrating a multi-phase DPD according to the third embodiment. "IN" of FIG. 10 represents a signal input to the multi-phase DPD 11. "SYSCLK" of FIG. 10 represents a clock signal having a constant cycle. The clock signal SYSCLK may be generated internally or externally to the multi-phase DPD 11. "SYSCLK CNT" of FIG. 10 represents a count of the clock signal SYSCLK. "Cumulative SYSCLK CNT" of FIG. 10 represents a cumulative count of the clock signal SYSCLK. "REF" of FIG. 10 represents a signal obtained by dividing the frequency of the input signal. That is, "REF" represents the reference frequency-divided signal REF. "COMP" of FIG. 10 represents the comparison frequency-divided signal COMP output from the comparison frequency divider 14.

The multi-phase DPD 11 counts the clock signal SYSCLK from a pulse of the reference frequency-divided signal REF at a point in time to a corresponding pulse of the comparison frequency-divided signal COMP. Such a count value of the clock signal SYSCLK may be referred to as the "count value in phase N0" in the following description.

At the same time of counting for phase N0, the multi-phase DPD 11 counts a phase shift of the reference frequency-divided signal REF using the clock signal SYSCLK. A count value of a first phase shift counting of the reference frequency-divided signal REF is 0. In the case of FIG. 10, a count value of a second phase shift counting of the reference frequency-divided signal REF is 26, and a count of a third phase shift counting of the reference frequency-divided signal REF is 42.

The multi-phase DPD 11 divides the frequency of the input signal by a certain value, and counts the clock signal SYSCLK at each interval boundary point (i.e. for each phase) obtained by dividing the frequency division number into equally-spaced wavenumber intervals, to thereby find a phase shift of the reference frequency-divided signal REF.

For example, the multi-phase DPD 11 divides the input signal IN of FIG. 10 into 1/14536 frequency, and counts the clock signal SYSCLK at each interval boundary point obtained by dividing the frequency division number, 14536, into 1024 equally-spaced wavenumber intervals, to thereby find a phase shift of the reference frequency-divided signal REF.

More specifically, the multi-phase DPD 11 counts the clock signal SYSCLK at each point where the clock number of the input signal IN is a multiple of 14 to thereby find a phase shift of the reference frequency-divided signal REF, as illustrated in FIG. 10. The number of the clock signal SYSCLK at a first interval boundary point is 0, the number of the clock signal SYSCLK at a second interval boundary point is 26, and the number of the clock signal SYSCLK at a third interval boundary point is 42. Note that the interval boundary points with multiples of 14 are obtained by dividing a 1/14536 frequency-divided input signal into 1024 equally-spaced wavenumber intervals. That is, 14 is obtained by rounding off a value given by 14536/1024.

Although counts for the phase shift measurements of the reference frequency-divided signal REF run parallel to each other at the interval boundary points obtained by dividing the input signal IN equally into 1024 intervals, the counts of all the phase shift measurements start at the same point. Therefore, the multi-phase DPD 11 is able to obtain a phase shift of the reference frequency-divided signal REF by capturing a count of the clock signal SYSCLK each time the clock number of the input signal IN indicates a multiple of 14. Then, the multi-phase DPD 11 accumulates the captured count values of the clock signal SYSCLK, to thereby calculate an area S1 illustrated in FIG. 10. The area S1 represents a cumulative value of the phase shifts of the reference frequency-divided signal REF in the phase comparison cycle. That is, the multi-phase DPD 11 does not have to be provided with 1024 counters in order to obtain the area S1. For example, if having one counter for counting the phase shifts, the multi-phase DPD 11 is able to obtain the area S1. Each point at which a phase shift of the reference frequency-divided signal REF is counted (i.e., a count value of the clock signal SYSCLK is captured) may be referred to as the "tap" in the following description.

Figure 11:
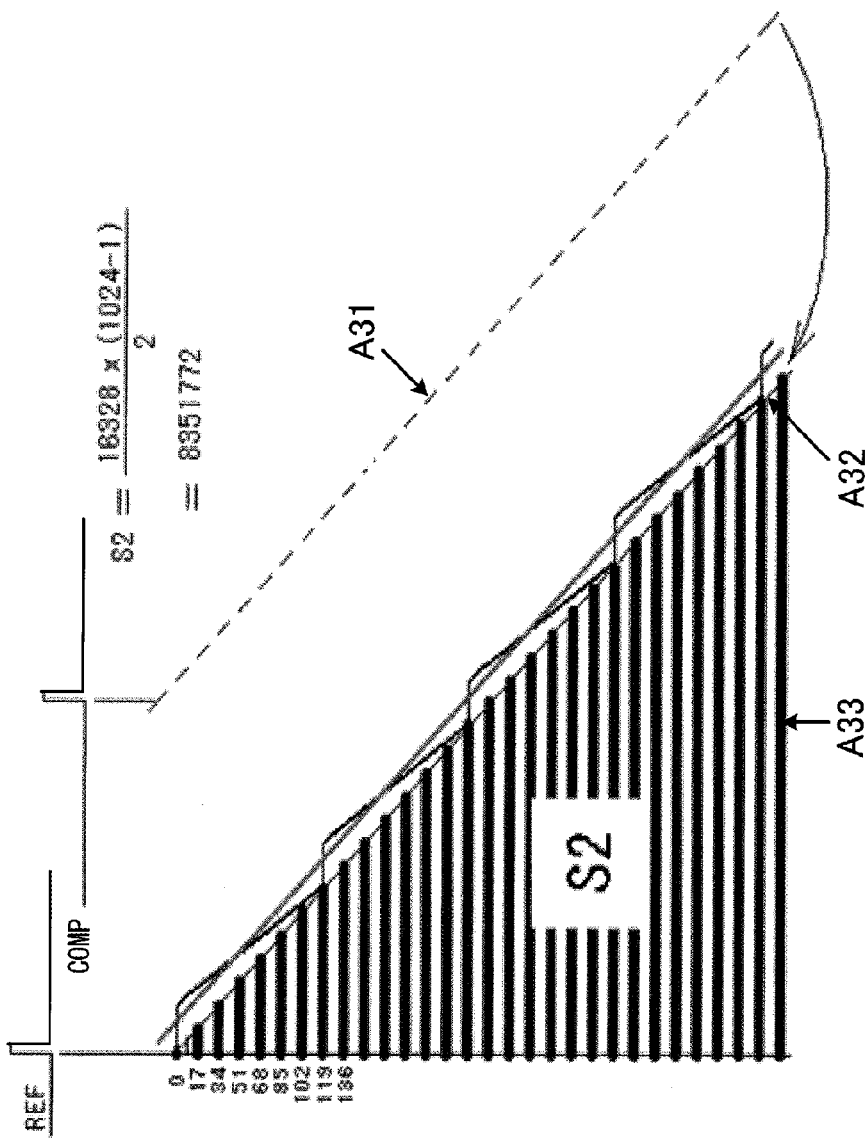
FIG. 11 is a second diagram illustrating the multi-phase DPD according to the third embodiment.

FIG. 11 is a second diagram illustrating the multi-phase DPD according to the third embodiment. The multi-phase DPD 11 captures a count value of the clock signal SYSCLK at each interval boundary point obtained by dividing, into equally-spaced time intervals, a count value of the clock signal SYSCLK corresponding to a frequency division number of the input signal, that is, a count value of the clock signal SYSCLK in one cycle of the reference frequency-divided signal REF (phase comparison cycle).

The multi-phase DPD 11 captures the clock signal SYSCLK, for example, every 17 counts, as indicated by "R" in FIG. 11. Here, the count of the clock signal SYSCLK in the phase comparison cycle is assumed to be 16328. About 17 clocks of the clock signal SYSCLK is obtained by dividing 16328 temporally by 1024.

The capturing of the clock signal SYSCLK is equivalent to calculating phases of the comparison frequency-divided signal COMP output from the comparison frequency divider 14, that is, calculating a dotted line indicated by an arrow A31 of FIG. 11. Note that the dotted line indicated by the arrow A31 is shifted in parallel to the left to form a solid line indicated by an arrow A32.

"Cumulative R" of FIG. 11 represents cumulative count values of the captured clock signal SYSCLK. A total cumulative count value of the captured clock signal SYSCLK corresponds to an area S2 illustrated in FIG. 11. The area S2 represents a cumulative phase of the comparison frequency-divided signal COMP in the phase comparison cycle.

The area S2 is obtained by the following equation (1), which is a formula to calculate the area of a triangle.

$$S2 = \{16328 \times (1024-1)\}/2 \qquad (1)$$

Note that the equation (1) provides the area obtained in the case where the count value of the clock signal SYSCLK in the phase comparison cycle being 16328 is divided by 1024. In other words, the calculation of the area S2 by the multi-phase DPD 11 uses the count value of the clock signal SYSCLK in one cycle of the reference frequency-divided signal REF as the base (indicated by an arrow A33 of FIG. 11) of the triangle; and the phase on the vertical axis as the height of the triangle. The area S2 is a constant value, and is 8351772 as calculated using the equation (1).

Figure 12:
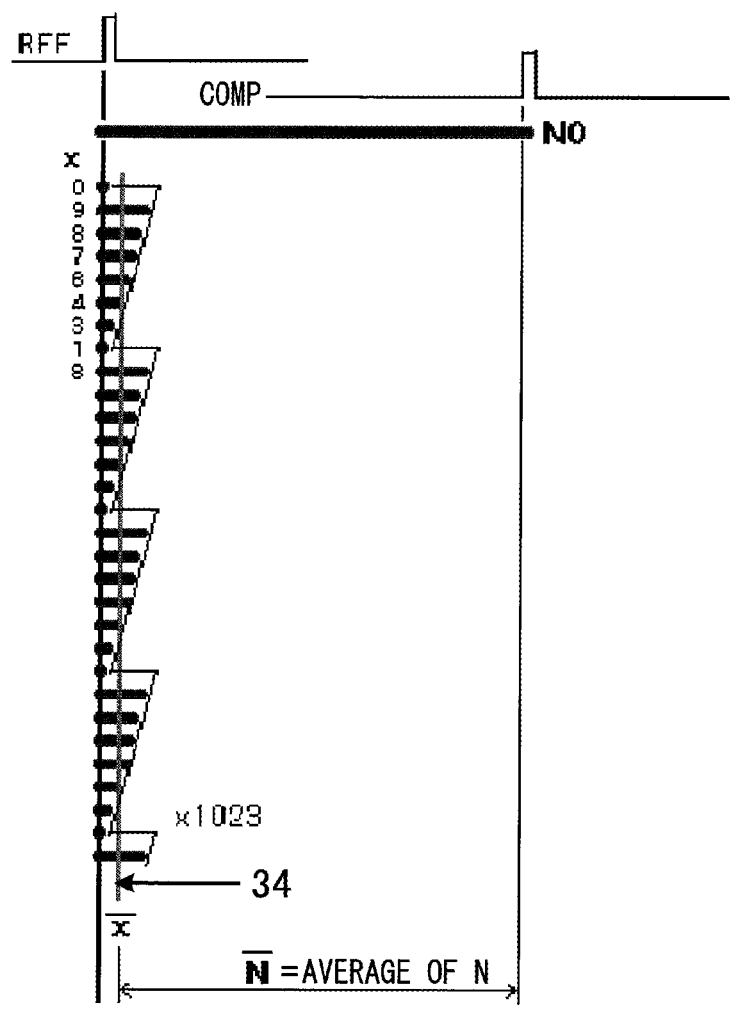
FIG. 12 is a third diagram illustrating the multi-phase DPD according to the third embodiment.

FIG. 12 is a third diagram illustrating the multi-phase DPD according to the third embodiment. A saw-tooth area of FIG. 12 is obtained by subtracting the area S1 of FIG. 10 from the area S2 of FIG. 11.

An average phase shift x of the reference frequency-divided signal REF is calculated by the following equation (2), which takes into consideration the number of taps.

$$x = (S1 - S2)/(\text{the number of taps}) \quad (2)$$

The average phase shift x corresponds to an arrow A34 of FIG. 12 (the average phase shift x is denoted by x-bar in FIG. 12).

The following equation (3) is used to correct a shift of the count value in phase N0 compared to the comparison frequency-divided signal COMP.

$$N = N0 - x \quad (3)$$

N in the equation (3) is an average DPD count, which is N-bar in FIG. 12.

Figure 13:
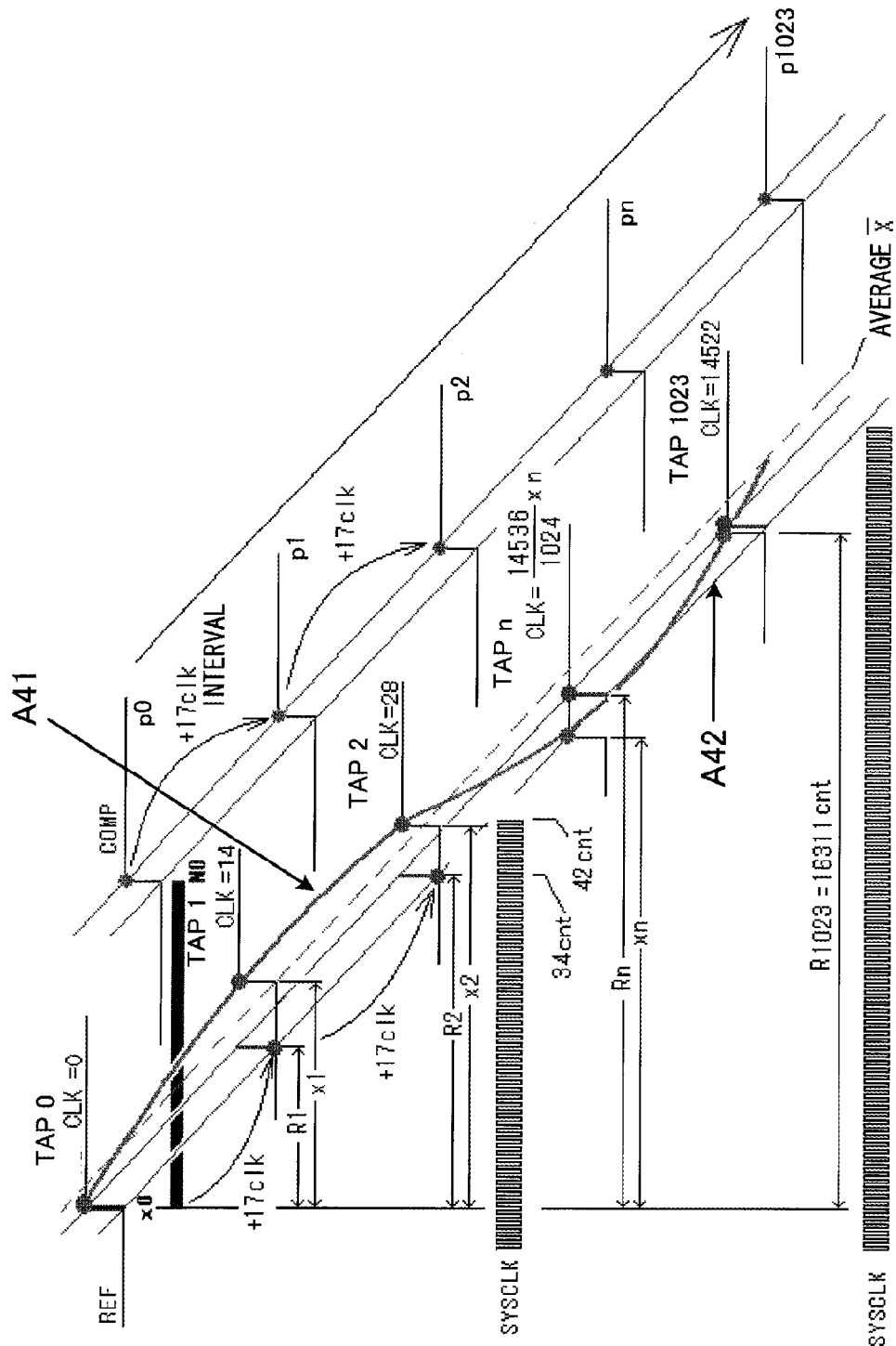
FIG. 13 is a fourth diagram illustrating the multi-phase DPD according to the third embodiment.

FIG. 13 is a fourth diagram illustrating the multi-phase DPD according to the third embodiment. The multi-phase DPD 11 counts the clock signal SYSCLK from a pulse of the reference frequency-divided signal REF to a corresponding pulse of the comparison frequency-divided signal COMP, as indicated by phase N0 of FIG. 13.

The multi-phase DPD 11 divides the input signal into 1/14536 frequency. Then, the multi-phase DPD 11 divides the 1/14536 frequency-divided input signal into 1024 equally-spaced wavenumber intervals, as indicated by taps 0 to 1023 (CLK 0, 14, 28, ..., and 14522) of FIG. 13.

The multi-phase DPD 11 resets a counter used to count the clock signal SYSCLK to zero at tap 0, and captures a count value of the clock signal SYSCLK to the counter at the subsequent tap 1 (CLK=14). From this point onward, the multi-phase DPD 11 captures a count value of the clock signal SYSCLK at each tap point in the same manner.

Note that, in the example of FIG. 13, a count value of the clock signal SYSCLK at tap 2 (CLK=28) is 42. Count values of the clock signal SYSCLK captured by the multi-phase DPD 11 do not form a linear pattern, as indicated by an arrow A41 of FIG. 13, because of phase shifts of the reference frequency-divided signal REF.

The multi-phase DPD 11 sequentially accumulates count values of the captured clock signal SYSCLK, to eventually obtain a total cumulative result S1. S1 here is, for example, the area S1 of FIG. 10.

The multi-phase DPD 11 captures the clock signal SYSCLK every 17 counts. For example, the multi-phase DPD 11 captures the clock signal SYSCLK at each point of p0, p1, ... and p1023 of FIG. 13 and accumulates the count values of the captured clock signal SYSCLK.

A straight line connecting p0, p1, ... and p1023 is shifted in parallel to the left to form a straight line indicated by an arrow A42 of FIG. 13. Note in FIG. 13 that a count value of the clock signal SYSCLK at p1 is 17×2=34.

The multi-phase DPD 11 accumulates count values of the clock signal SYSCLK at p0, p1, ... and p1023 of FIG. 13. The total cumulative count value of the captured clock signal SYSCLK is calculated by the following equation (4).

$$S2 = \{\text{count of SYSCLK in phase comparison cycle} \times (\text{number of taps} - 1)\}/2 \quad (4)$$

Note that the equation (4) is equivalent to the equation (1). S2 is a constant value, and may be calculated in advance.

The multi-phase DPD 11 calculates the average phase shift x of the reference frequency-divided signal REF by assigning the above-described S1, S2, and the number of taps to the equation (2). In addition, the multi-phase DPD 11 calculates an average shift of the count value in phase N0 from the comparison frequency-divided signal COMP using the above-described equation (3).

Figure 14:
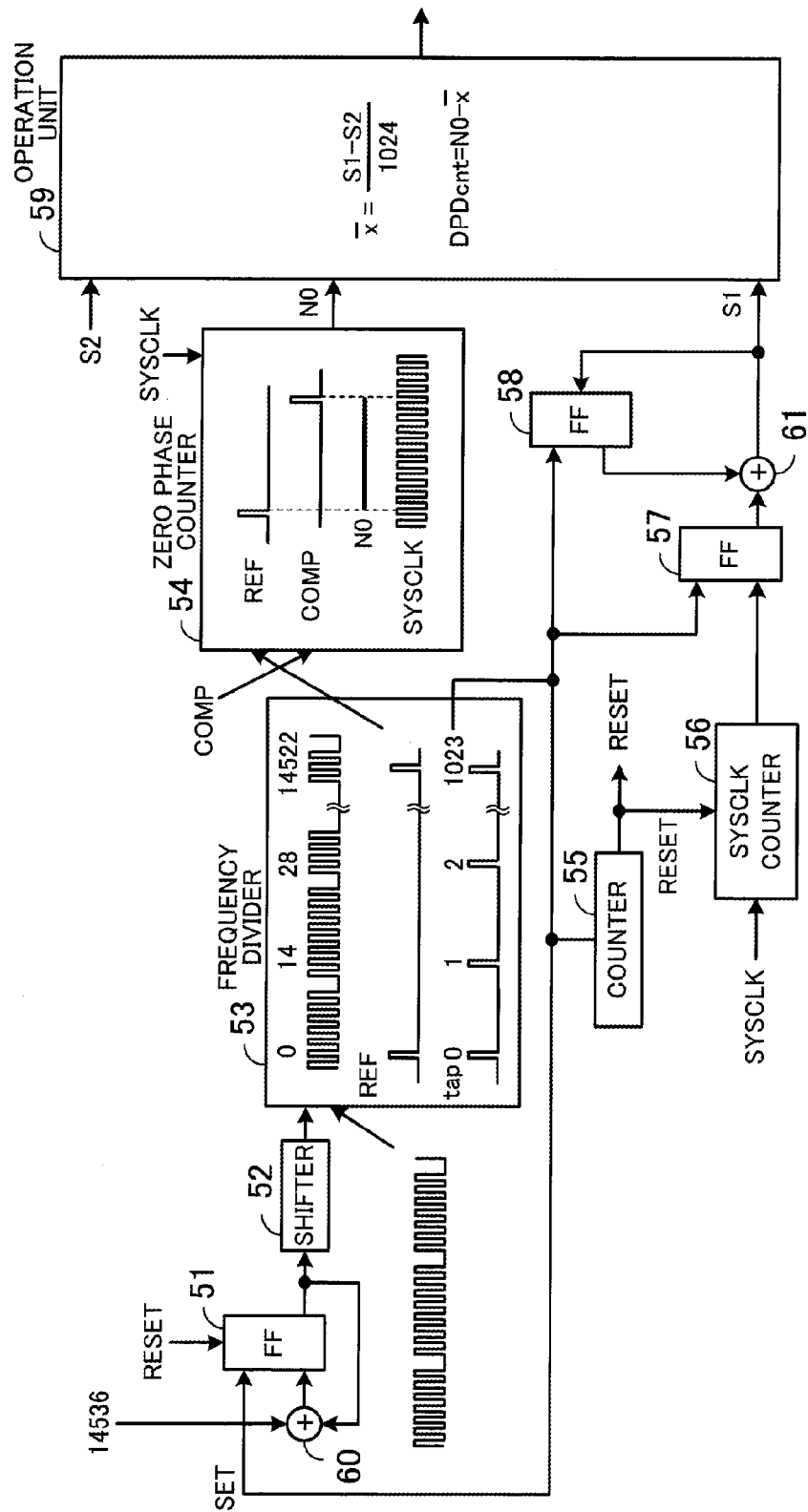
FIG. 14 illustrates a hardware configuration example of the multi-phase DPD.

FIG. 14 illustrates a hardware configuration example of a multi-phase DPD. The multi-phase DPD 11 includes flip-flops (FF) 51, 57, and 58, a shifter 52, a frequency divider 53, a zero phase counter 54, a counter 55, a SYSCLK counter 56, an operation unit 59, and adders 60 and 61, as illustrated in FIG. 14.

The adder 60 adds 14536 in binary form and a binary number output from the flip-flop 51. To the flip-flop 51, a binary number output from the adder 60 and a tap signal output from the frequency divider 53 are input. The shifter 52 shifts the binary number output from the flip-flop 51 by 10 bits. The shifter 52 outputs a counting pattern of, 0, 14, 28, ..., 14522. Note that the shifter 52 rounds off the value output from the flip-flop 51 and then outputs the rounded-off value. To the frequency divider 53, a signal with gaps in the sequence of pulses is input. A waveform of the signal input to the frequency divider 53 is depicted at the top in the frequency divider 53 of FIG. 14. That is, this waveform is that of the signal input to the multi-phase DPD 11. The frequency divider 53 divides the input signal into 1/14536 frequency to thereby generate the reference frequency-divided signal REF, a waveform of which is depicted in the middle of the frequency divider 53 of FIG. 14.

Based on the counting pattern output from the shifter 52, the frequency divider 53 generates pulses of the tap signal for counting the clock signal SYSCLK. A pulse of the tap signal is generated at each interval boundary point obtained by dividing the frequency division number (i.e., 14536) of the input signal into equally-spaced wavenumber intervals. Note that a waveform of the tap signal is depicted at the bottom in the frequency divider 53 of FIG. 14.

The reference frequency-divided signal REF, the comparison frequency-divided signal COMP output from the frequency divider 14, and the clock signal SYSCLK are input to the zero phase counter 54. The zero phase counter counts the clock signal SYSCLK from a pulse of the reference frequency-divided signal REF to a corresponding pulse of the comparison frequency-divided signal COMP. In other words, the zero phase counter 54 counts the clock signal SYSCLK for phase N0.

To the counter 55, the tap signal is input. The counter 55 counts pulses of the tap signal and, then, outputs a reset signal RESET when the tap signal count has reached 1024. That is, the counter 55 outputs the reset signal RESET for each cycle of the reference frequency-divided signal REF. With this, the multi-phase DPD 11 calculates the average phase shift of the reference frequency-divided signal REF in the phase comparison cycle, which corresponds to one cycle of the reference frequency-divided signal REF. To the SYSCLK counter 56, the clock signal SYSCLK is input. The SYSCLK counter 56 counts the clock signal SYSCLK.

To the flip-flop 57, count values of the clock signal SYSCLK and pulses of the tap signal are input. The flip-flop 57 outputs a count value of the clock signal SYSCLK when a pulse of the tap signal is input. In other words, the flip-flop 57 captures a count value of the clock signal SYSCLK according to the timing of each pulse of the tap signal output from the frequency divider 53.

The adder 61 adds the count value of the clock signal SYSCLK captured by the flip-flop 57 and a value output from the flip-flop 58. The adder 61 then outputs a cumulative count of the clock signal SYSCLK, which indicates the size of the area S1. The flip-flop 58 outputs, to the adder 61, the cumulative count value of the clock signal SYSCLK output from the adder 61 according to the tap signal.

To the operation unit 59, the size of the area S1 output from the adder 61 and the count value in phase N0 output from the zero phase counter 54 are input. In addition, the size of the area S2 is also input to the operation unit 59. Because being a constant value as described in relation to the equations (1) and (4) above, the size of the area S2 may be calculated in advance and input to the operation unit 59. The operation unit 59 calculates the average phase shift of the reference frequency-divided signal REF based on the equation (2). Then, based on the equation (3), the operation unit 59 calculates a correction value for correcting the shift of the count value in phase N0 compared to the comparison frequency-divided signal COMP. The correction value is output to the LPF 12 of FIG. 2.

In the above-described manner, the PLL divides the input signal into equally-spaced wavenumber intervals, and accumulates count values of the counter 55 captured at the taps obtained by the division, to thereby calculate the area S1. The PLL also counts the phase difference in phase N0. The PLL then subtracts, from the calculated area S1, the cumulative count (S2) obtained by accumulating count values of the counter 55 captured at interval boundary points, which are obtained by dividing the input signal into equally-spaced time intervals. The resultant value is then divided by the number of taps to thereby calculate the average phase shift x. Subsequently, the average phase shift x is subtracted from the count value in phase N0 to thereby calculate the average DPD count value. This allows the PLL to exhibit improved tracking performance of the output signal to the input signal.

Figure 15:
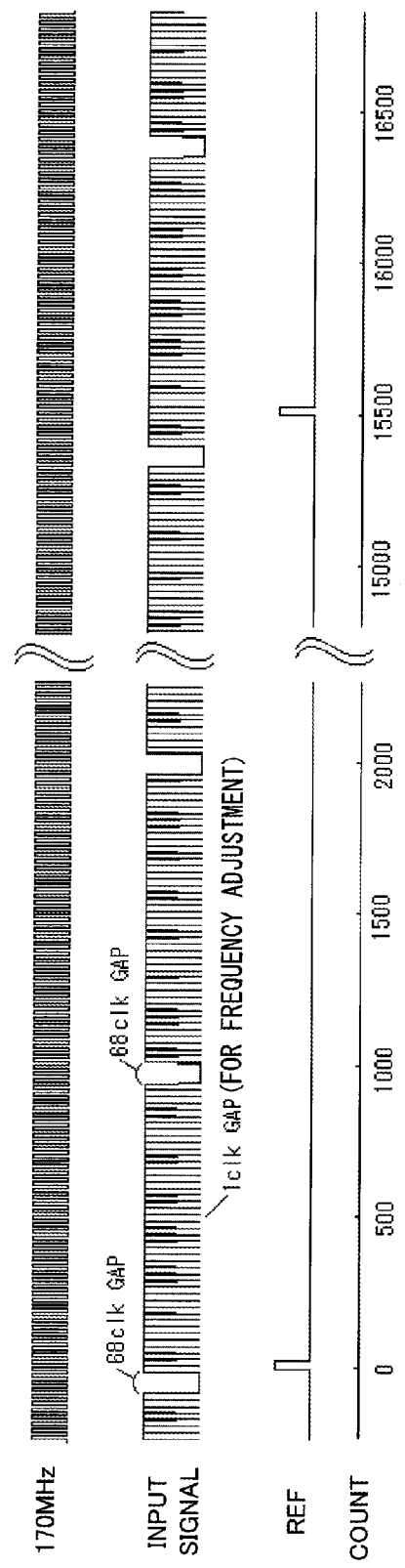
FIG. 15 illustrates a simulation performed on the multi-phase DPD.

Next described is a result of a simulation performed on the multi-phase DPD 11. FIG. 15 illustrates a simulation performed on a multi-phase DPD. In FIG. 15, a reference signal having a frequency of 170 MHz is depicted at the top, and count values (clock number) of the reference signal are depicted at the bottom.

The second signal (input signal) from the top in FIG. 15 represents a signal input to the multi-phase DPD 11. This input signal is produced by removing pulses from the reference signal every 1000 clocks, and has a frequency of 155 MHz.

The input signal has a large gap of, for example, 68 clocks every 1000 clocks. In addition, gaps of 1 clock are present at certain intervals in order to provide fine frequency adjustment.

The third signal (REF) from the top in FIG. 15 represents a reference frequency-divided signal. The reference frequency-divided signal REF of FIG. 15 corresponds to, for example, the reference frequency-divided signal REF of FIG. 9 or the reference frequency-divided signal REF of FIG. 12. The reference frequency-divided signal REF of FIG. 15 is produced by dividing the input signal into 1/15500 frequency, and has a frequency of about 10 kHz.

Figure 16:
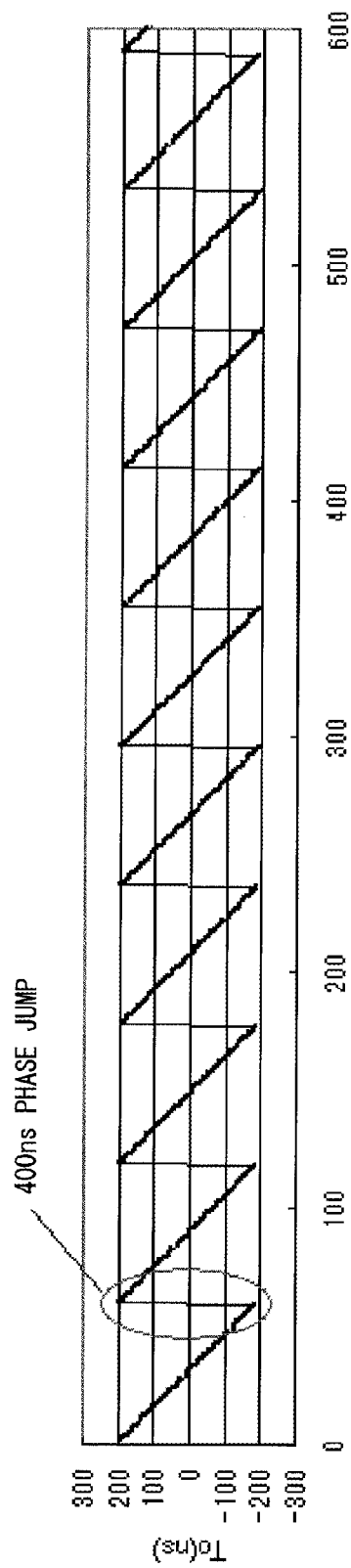
FIG. 16 illustrates an output result of a simulation performed on the DPD.

FIG. 16 illustrates an output result of a simulation performed on a DPD. In FIG. 16, the vertical axis represents the phase difference measured with the use of a nominal cycle of 10 kHz as the phase comparison cycle, and the horizontal axis represents the time expressed in the number of points of the 10-kHz cycle.

In the DPD, when an interval boundary point falls on a gap of 68 clocks, a phase jump corresponding to the gap of 68 clocks of 170 MHz (5.9 ns×68≈400 ns) occurs, as illustrated in FIG. 16.

Figure 17A:
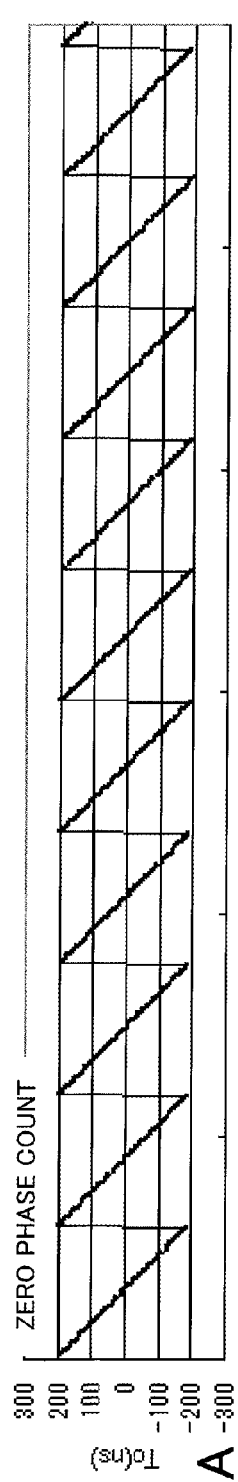
FIGS. 17A, 17B, and 17C illustrate results of the simulation performed on the multi-phase DPD.
Figure 17B:
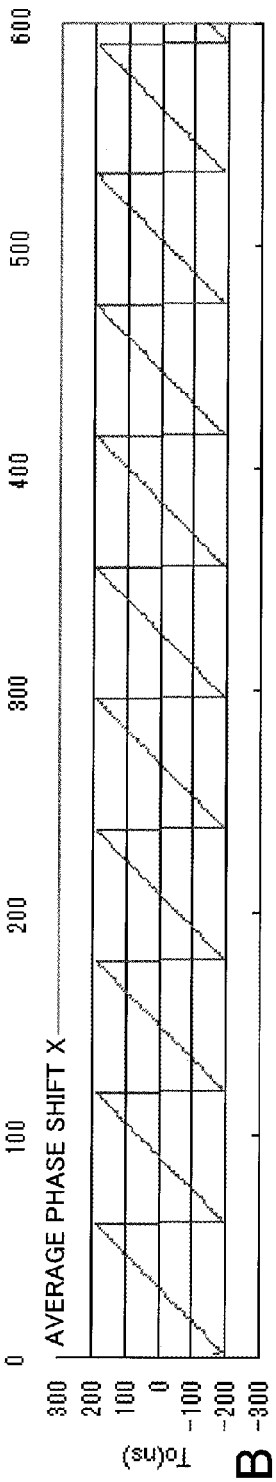
Figure 17C:
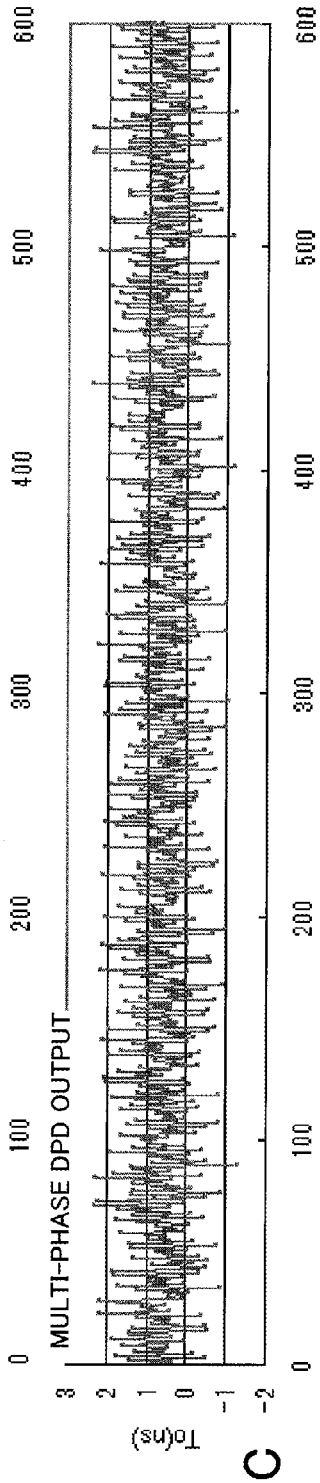

FIGS. 17A, 17B, and 17C illustrate results of the simulation performed on the multi-phase DPD. FIG. 17A illustrates phase changes in phase N0. In phase N0, phase jumps of about 400 nanoseconds (ns) occur, as in the case of FIG. 16. FIG. 17B illustrates average phase shifts of the reference frequency-divided signal REF calculated by the multi-phase DPD 11 based on the equation (2). FIG. 17C illustrates average DPD counts calculated by the multi-phase DPD 11 based on the equation (3). FIG. 17C is obtained by addition of FIGS. 17A and 17B. It is seen in FIG. 17C that the multi-phase DPD 11 controls the gaps to the extent of a noise level of about 3 ns.

Figure 18:
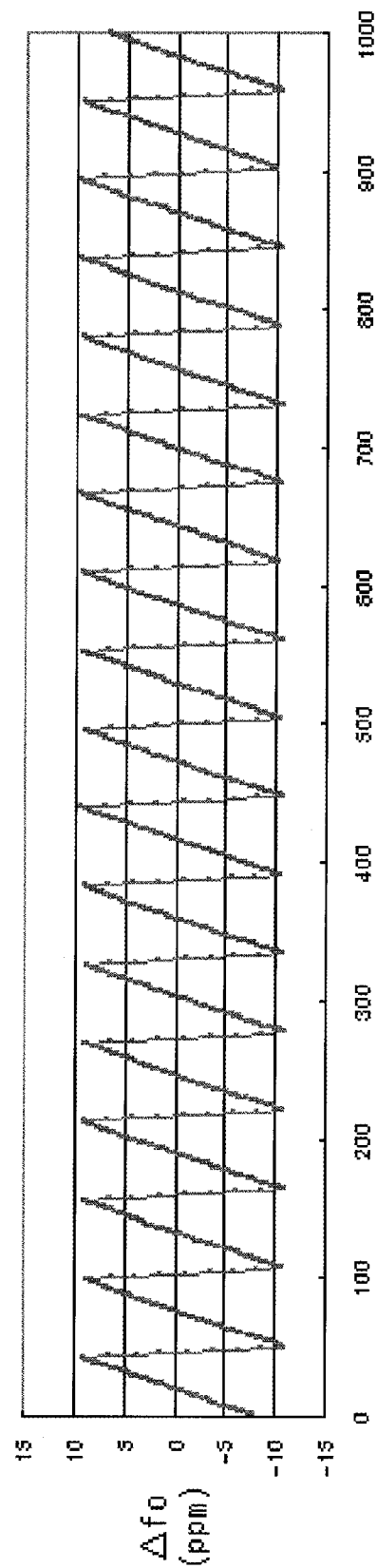
FIG. 18 is a first diagram illustrating an output result of a simulation performed on a PLL provided with the DPD.

FIG. 18 is a first diagram illustrating an output result of a simulation performed on a PLL provided with a DPD. In the example of FIG. 18, the output of the PLL is 20 MHz, and the frequency division number of the comparison frequency divider is 2000. In FIG. 18, the vertical axis represents the output frequency deviation, and the horizontal axis represents the time expressed in the number of points of the 10-kHz cycle. The PLL is configured to have a cutoff frequency of 10 Hz, a damping factor of 1.0, and a phase comparison cycle of 10 kHz.

In the case where a DPP is provided for the PLL, phases of a signal input to the LPF change as illustrated in FIG. 16. Therefore, the PLL changes the frequency of a signal to be output so that the output signal follows the phases of the input signal. In FIG. 18, the signal output from the PLL shows frequency changes in the range of about ±10 ppm. The frequency changes of ±10 ppm and cycle repetition cause frequency modulation (FM) of the output signal of the PLL. Therefore, it is easy to assume that in the PLL having a DPD, the purity of the output signal may decrease.

Figure 19:
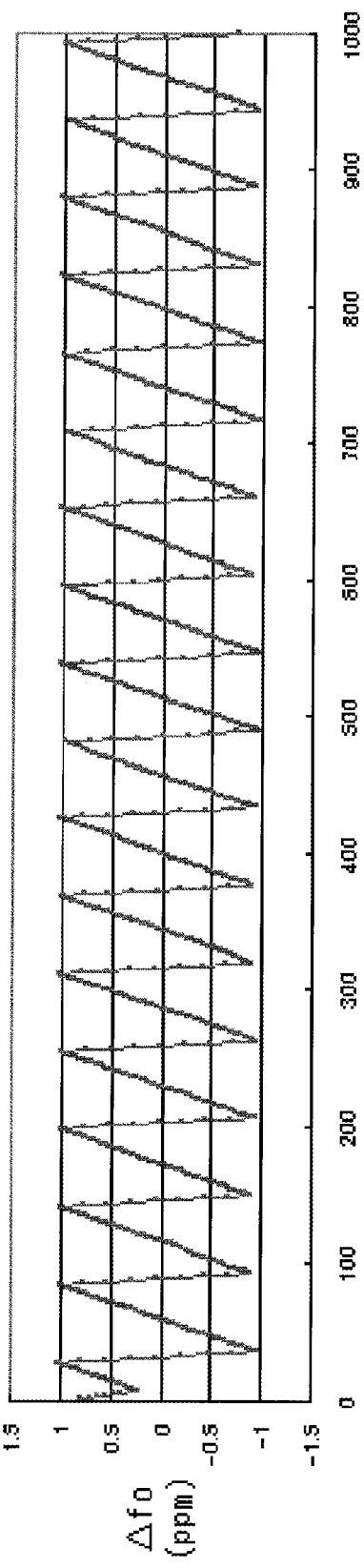
FIG. 19 is a second diagram illustrating an output result of the simulation performed on the PLL provided with the DPD.

FIG. 19 is a second diagram illustrating an output result of a simulation performed on the PLL provided with a DPD. In the simulation of FIG. 19, the cutoff frequency of the PLL is reduced to 1 Hz, compared to the case of FIG. 18 where the cutoff frequency is 10 Hz. The reduced cutoff frequency reduces the range of frequency changes to around ±1 ppm, which is an improvement compared to the case of FIG. 18 where the range of frequency changes is about ±10 ppm.

Figure 20:
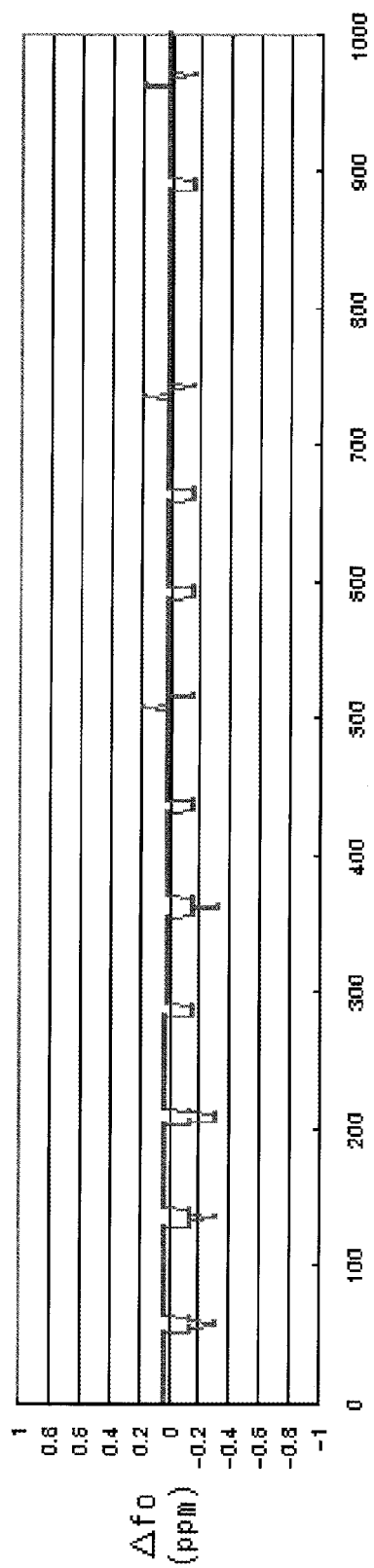
FIG. 20 is a first diagram illustrating a result of a simulation performed on a PLL provided with the multi-phase DPD.

FIG. 20 is a first diagram illustrating a result of a simulation performed on a PLL provided with a multi-phase DPD. In FIG. 20, the vertical axis represents the output frequency deviation, and the horizontal axis represents the time expressed in the number of points of the 10-kHz cycle. The signal of FIG. 15 is input to the PLL which has a cutoff frequency of 10 Hz.

In the PLL provided with the multi-phase DPD 11 of FIG. 2, phase shifts of the reference frequency-divided signal REF due to the gaps in the input signal are reduced. As a result, the frequency changes of the output signal of the PLL fall in a range of about ±0.2 ppm, which is improved to 1/50 compared to the case of the PLL provided with the DPD of FIG. 19.

Figure 21:
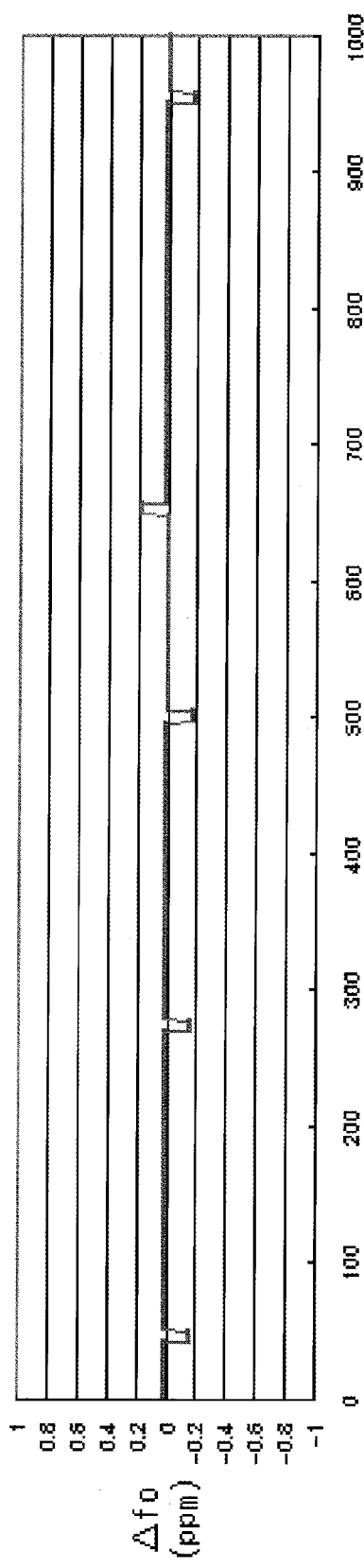
FIG. 21 illustrates a result of a simulation in which a signal with no gaps is input to the PLL provided with the DPD.

FIG. 21 illustrates a result of a simulation in which a signal with no gaps is input to a PLL provided with a DPD. The PLL having the DPD has a cutoff frequency of 10 Hz and a phase comparison cycle of 10 kHz.

It is seen by comparing the simulation results of FIGS. 20 and 21 that the frequency changes of FIG. 20 are much the same as those of FIG. 21. That is, the PLL having the multi-phase DPD 11 is comparable in frequency changes to the PLL having the DPD, to which a signal with no gaps is input.

Figure 22:
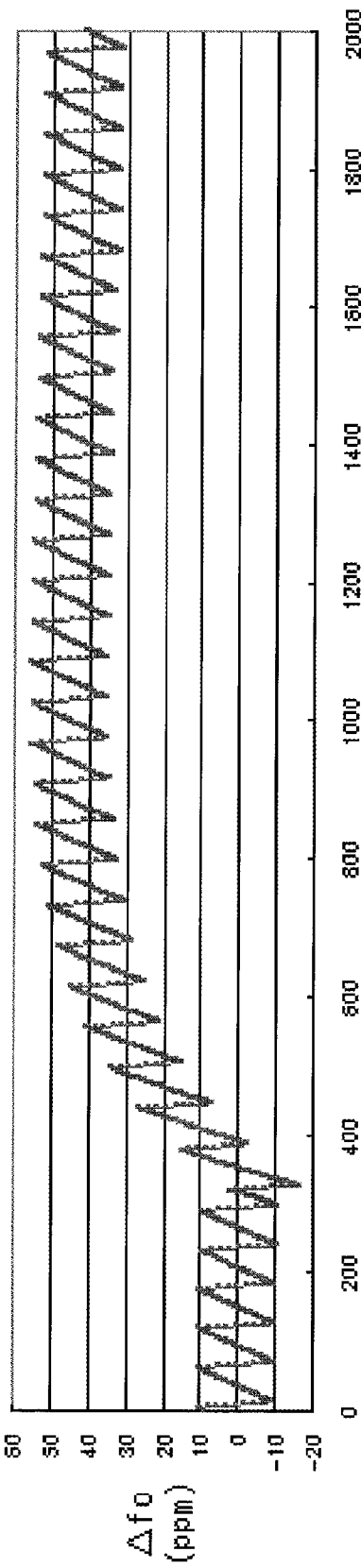
FIG. 22 illustrates a frequency change simulation performed on the PLL provided with the DPD.

Next described is the stability of frequency changes of PLLs. FIG. 22 illustrates a frequency change simulation performed on a PLL provided with a DPD. In FIG. 22, the vertical axis represents the output frequency deviation of the PLL, and the horizontal axis represents the time expressed in the number of points of the 10-kHz cycle.

The signal with gaps illustrated in FIG. 16 is input to the LPF of the PLL, and a stepwise change of 40 ppm is applied to the input frequency at 300 points in time. The PLL is configured to have a cutoff frequency of 10 Hz, a damping factor of 1.0, and a phase comparison frequency of 10 kHz.

Phases of the input signal change in a saw-tooth pattern, as illustrated in FIG. 16. Therefore, the PLL of FIG. 22 changes the output frequency so that the output signal follows the input frequency change of 40 ppm while being accompanied by frequency changes in the range of about ±10 ppm to follow the phases of the input signal.

Figure 23:
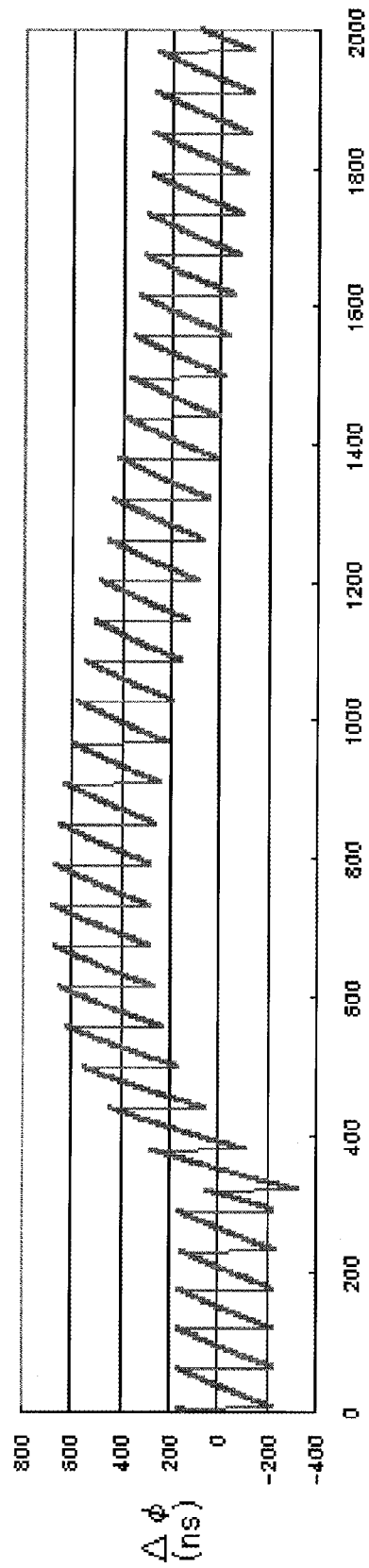
FIG. 23 illustrates a phase change simulation performed on the PLL provided with the DPD.

FIG. 23 illustrates a phase change simulation performed on a PLL provided with a DPD. The same conditions as those of the PLL of FIG. 22 are applied to the PLL of FIG. 23. Because phases of the input signal fluctuate at the gaps in the input signal, as illustrated in FIG. 16, the PLL of FIG. 23 changes the output frequency so that the output signal follows the input frequency change of 40 ppm while being accompanied by phase changes in the range of about ±200 ns to follow the phases of the input signal.

Figure 24:
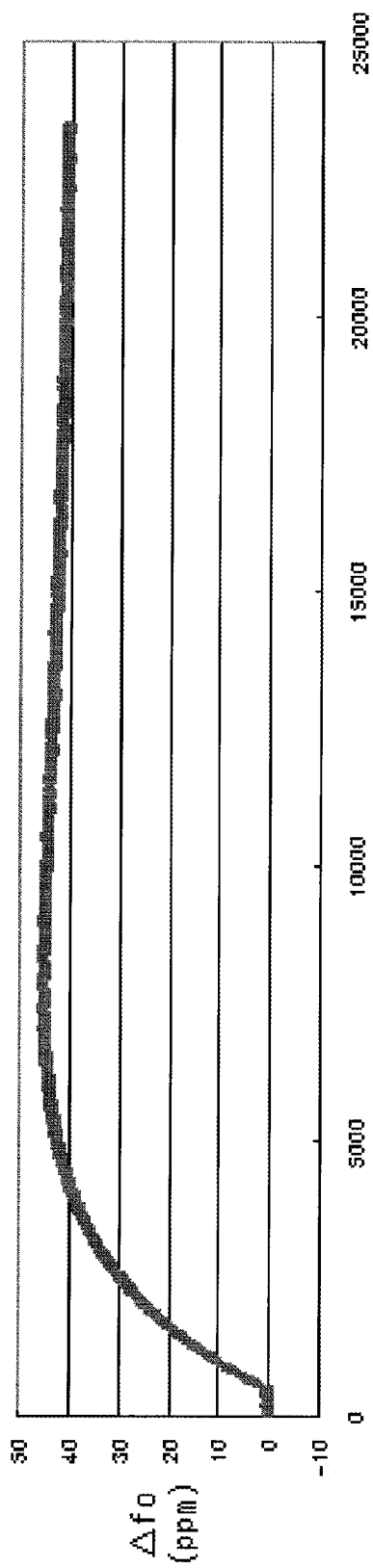
FIG. 24 illustrates a frequency change simulation performed on the PLL provided with the DPD.

FIG. 24 illustrates a frequency change simulation performed on a PLL provided with a DPD. In the simulation of FIG. 24, the cutoff frequency of the PLL is reduced to 1 Hz, compared to the case of FIG. 23 where the cutoff frequency is 10 Hz.

In the case where the cutoff frequency of the PLL is 1 Hz according to FIG. 24, the output frequency lags, presenting poor tracking performance. In the simulation of FIG. 24, it takes about 20000 points in time until the output frequency converges, which is 10 times as much as in the case of FIG. 22. That is, in the PLL having the DPD, the high-speed operation is traded off against the filtering out of the phase jump effect due to the gaps in the input signal.

Figure 25:
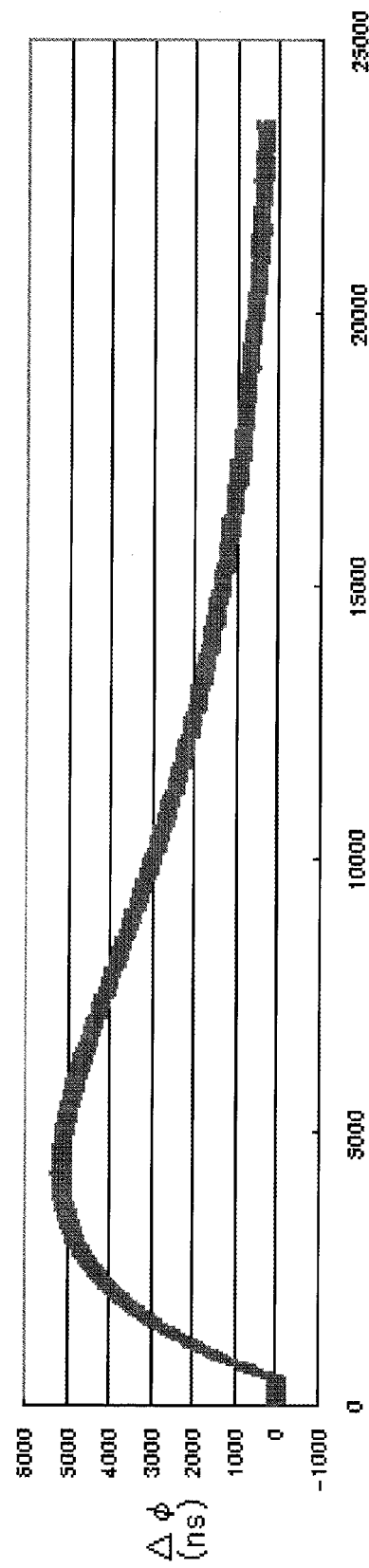
FIG. 25 illustrates a phase change simulation performed on the PLL provided with the DPD.

FIG. 25 illustrates a phase change simulation performed on a PLL provided with a DPD. The same conditions as those of the PLL of FIG. 24 are applied to the PLL of FIG. 25. In the simulation of FIG. 25, it takes about 20000 points in time until the phase changes converge.

Figure 26:
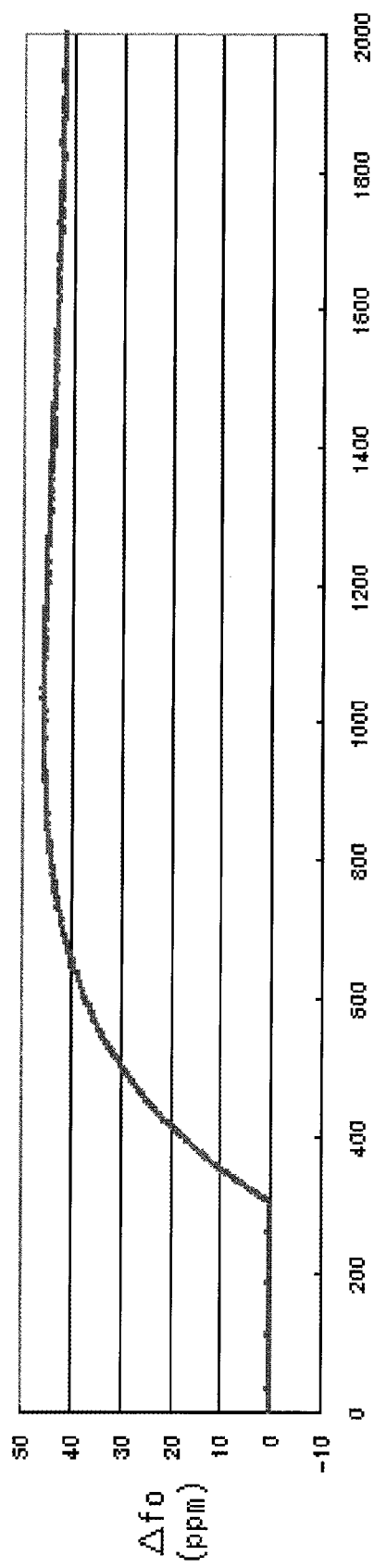
FIG. 26 illustrates a frequency change simulation performed on the PLL provided with the multi-phase DPD.

FIG. 26 illustrates a frequency change simulation performed on a PLL provided with a multi-phase DPD. In FIG. 26, the vertical axis represents the output frequency deviation of the PLL, and the horizontal axis represents the time expressed in the number of points of the 10-kHz cycle.

The signal with gaps illustrated in FIG. 15 is input to the PLL of FIG. 26, and a change of 40 ppm is applied to the input frequency at 300 points in time. The PLL of FIG. 26 is configured to have a cutoff frequency of Hz, a damping factor of 1.0, and a phase comparison frequency of 10 kHz.

According to FIG. 26, the PLL having the multi-phase DPD 11 does not have to reduce the cutoff frequency in order to control the frequency changes due to the gaps in the input signal. In the case of the PLL of FIG. 26, the output signal follows the input frequency changes while being accompanied by frequency changes in the range of about ±5 ppm, whereas in the case of the PLL of FIG. 22, for example, the range of the accompanying frequency changes of the output signal is about ±10 ppm.

Figure 27:
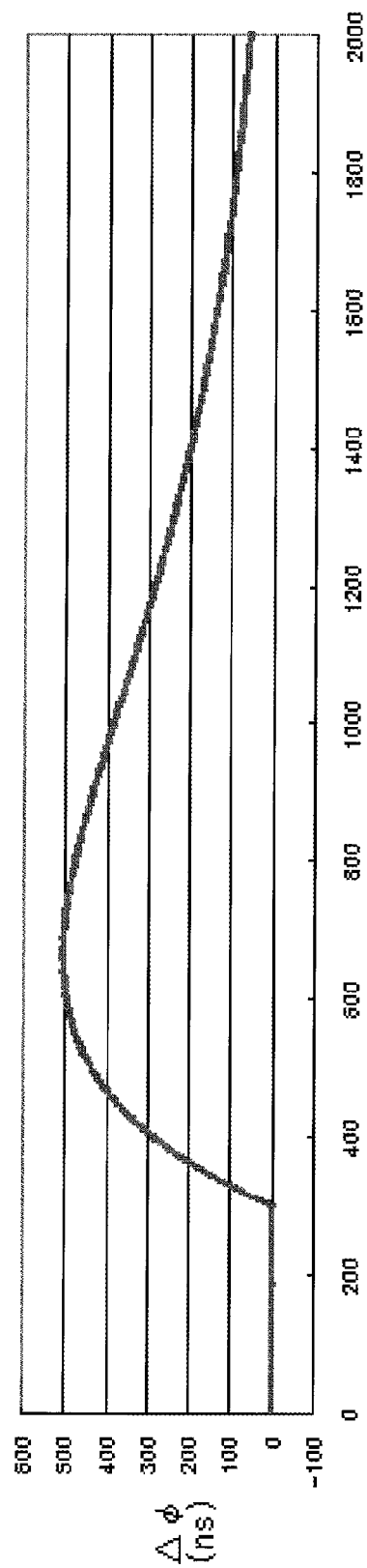
FIG. 27 illustrates a phase change simulation performed on the PLL provided with the multi-phase DPD.

FIG. 27 illustrates a phase change simulation performed on a PLL provided with a multi-phase DPD. The same conditions as those of the PLL of FIG. 26 are applied to the PLL of FIG. 27.

According to FIG. 27, the PLL having the multi-phase DPD 11 does not have to reduce the cutoff frequency in order to control the phase changes due to the gaps in the input signal. In the case of the PLL of FIG. 27, the output signal follows the input frequency changes while being accompanied by phase changes in the range of about ±10 ns or less, whereas in the case of the PLL of FIG. 23, for example, the range of the accompanying phase changes of the output signal is about ±200 ns.

Figure 28:
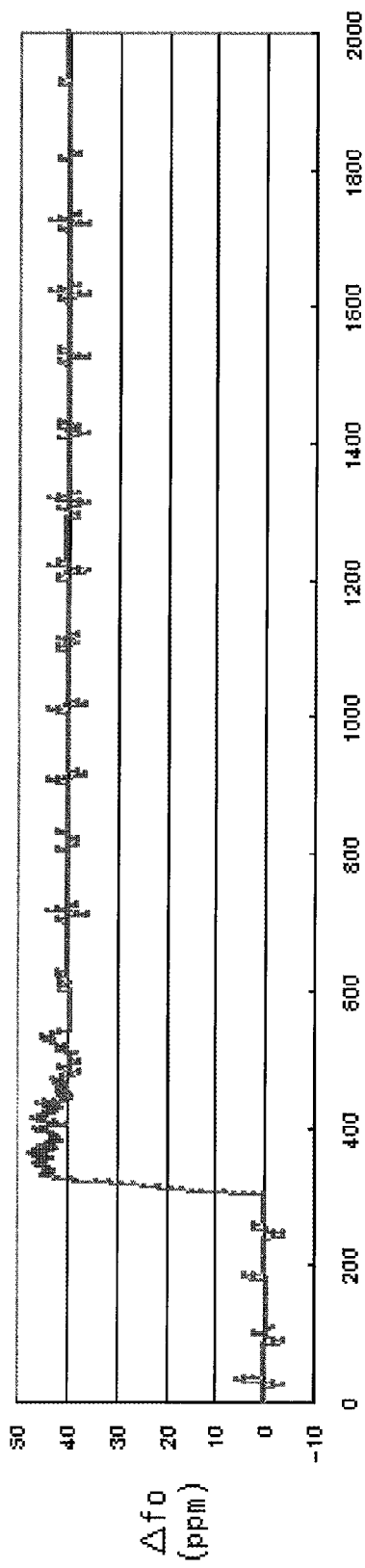
FIG. 28 illustrates a frequency change simulation performed on the PLL provided with the multi-phase DPD.

FIG. 28 illustrates a frequency change simulation performed on a PLL provided with a multi-phase DPD. In the simulation of FIG. 28, the cutoff frequency of the PLL is increased to 100 Hz, compared to the case of FIG. 26 where the cutoff frequency is 10 Hz.

In the case of the PLL having the multi-phase DPD 11 according to FIG. 28, the effect of the gaps in the input signal on the frequency changes of the output signal is still small with the increased cutoff frequency of 100 Hz. In addition, the PLL having the multi-phase DPD 11 achieves high-speed frequency responses to the frequency changes of the input signal.

Figure 29:
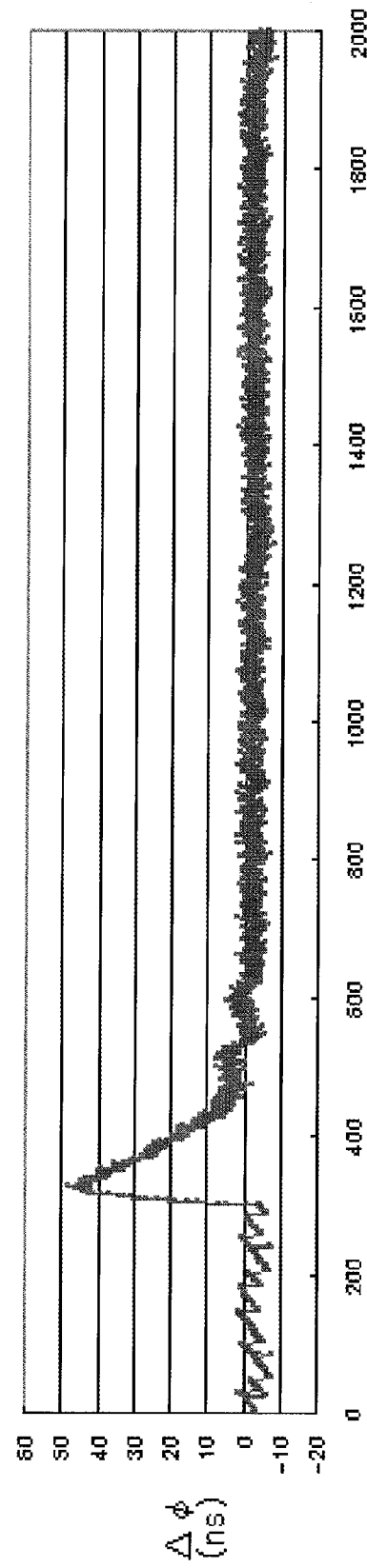
FIG. 29 illustrates a phase change simulation performed on the PLL provided with the multi-phase DPD.

FIG. 29 illustrates a phase change simulation performed on a PLL provided with a multi-phase DPD. The same conditions as those of the PLL of FIG. 28 are applied to the PLL of FIG. 29.

In the case of the PLL having the multi-phase DPD 11 according to FIG. 29, the effect of the gaps in the input signal on the phase changes of the output signal is still small with the increased cutoff frequency of 100 Hz. In addition, the PLL having the multi-phase DPD 11 achieves high-speed frequency responses to the phase changes of the input signal.

In the case of the PLLs provided with a DPD above, an increase in the cutoff frequency causes changes in the frequency of the output signal according to the phase changes of the reference frequency-divided signal REF, and jitter performance of the output signal is degraded. Because of this, in the PLLs having a DPD, the cutoff frequency of a loop filter needs to be reduced, which prevents achievement of high-speed responses to the input signal.

On the other hand, the PLLs provided with the multi-phase DPD 11 above produce a stable output even when the cutoff frequency is increased, and also achieve high-speed responses to the input signal, as described above. This allows the PLLs having the multi-phase DPD 11 to exercise two-stage cutoff frequency control in which the cutoff frequency is set to a first frequency at the time of the start-up of the PLLs and subsequently set to a second frequency which is lower than the first frequency.

Figure 30:
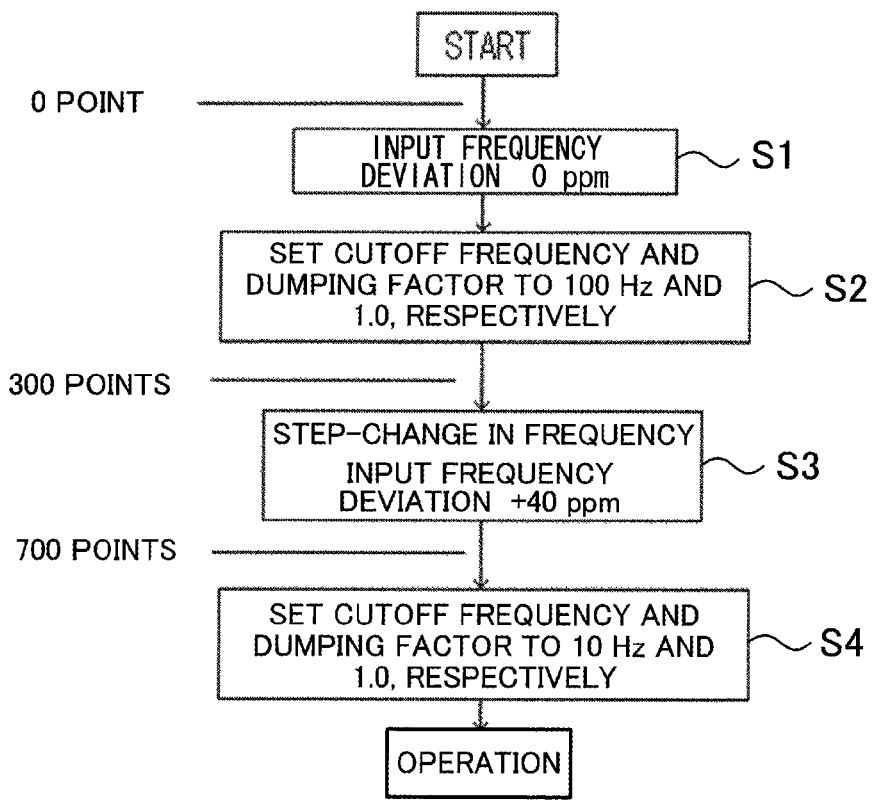
FIG. 30 is a flowchart illustrating control for cutoff frequency switching.

FIG. 30 is a flowchart illustrating control for cutoff frequency switching. Assume here that one point in time corresponds to 0.1 millisecond (ms).

[Step S1] A signal with an input frequency deviation of 0 ppm is input to a PLL having the multi-phase DPD 11.

[Step S2] A control unit (not illustrated in FIG. 2) of the PLL sets the cutoff frequency of the LPF 12 and the damping factor of the VCO 13 of the PLL to 100 Hz and 1.0, respectively. Note that the LPF 12 is formed, for example, with a digital filter, and the control unit changes the cutoff frequency by changing a coefficient of the digital filter.

[Step S3] When 300 points in time have elapsed, it is assumed that the signal input to the PLL has a step-change in frequency. The frequency deviation of the input signal is 40 ppm.

[Step S4] When 700 points in time have elapsed, the control unit sets the cutoff frequency of the LPF 12 and the damping factor of the VCO 13 of the PLL to 10 Hz and 1.0, respectively.

In this manner, the control unit reduces the cutoff frequency of the loop filter (the LPF 12) after a signal is input and then a certain period of time (700 points in time in the example of FIG. 30) has elapsed. That is, the control unit is configured to switch the frequency of the loop filter before and after a change in the frequency of the input signal.

Figure 31:
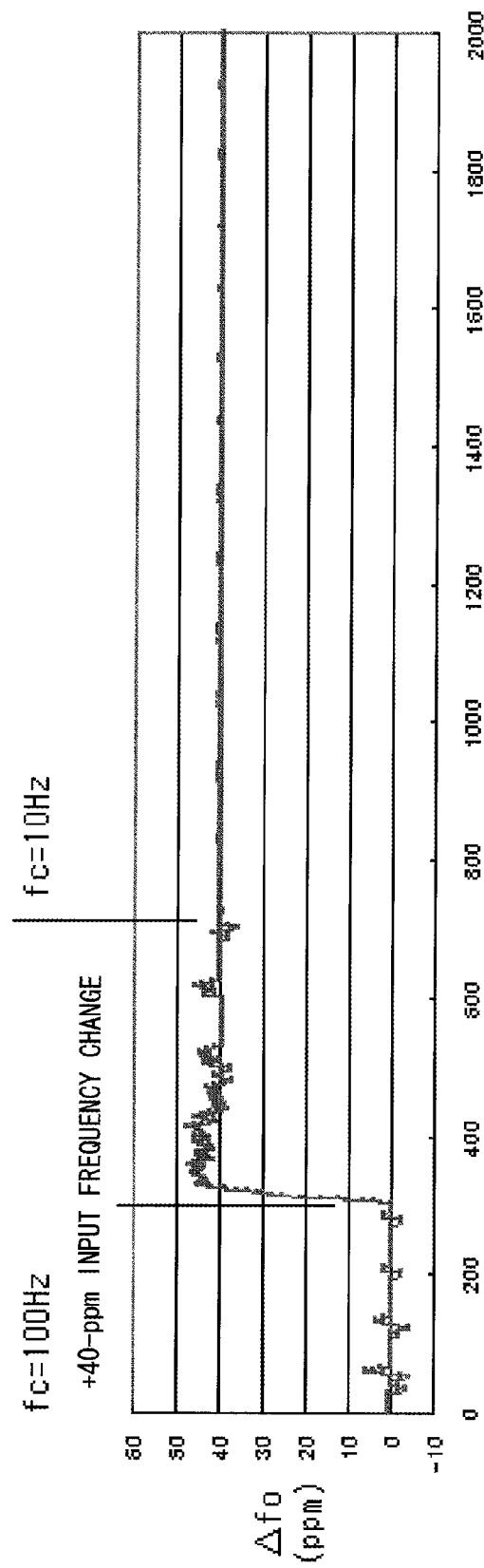
FIG. 31 illustrates a frequency change simulation accompanied by loop filter control.

FIG. 31 illustrates a frequency change simulation performed on a PLL provided with a multi-phase DPD, accompanied by loop filter control. In FIG. 31, the vertical axis represents the output frequency deviation of the PLL, and the horizontal axis represents the time expressed in the number of points of the 10-kHz cycle.

The signal with gaps illustrated in FIG. 15 is input to the PLL of FIG. 31, and a change of 40 ppm is applied to the input frequency at 300 points in time. The cutoff frequency and damping factor of the PLL are set to 100 Hz and 1.0, respectively, up to 700 points in time, and then set to 10 Hz and 1.0, respectively, after 700 points in time onward.

The frequency deviation of the output signal quickly converges (at around 350 points in time) by the loop filter with a 100-Hz cutoff frequency, as illustrated in FIG. 31. In addition, after 700 points in time, the frequency deviation of the output signal is stabilized by the loop filter with a 10-Hz cutoff frequency.

Figure 32:
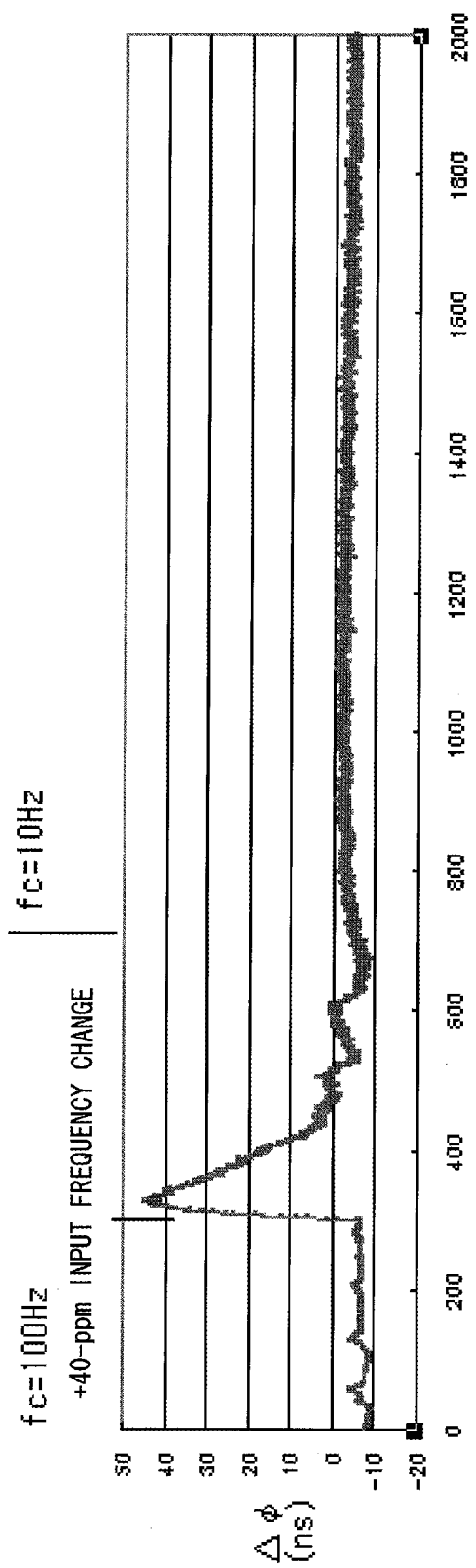
FIG. 32 illustrates a phase change simulation accompanied by the loop filter control.

FIG. 32 illustrates a phase change simulation performed on a PLL provided with a multi-phase DPD, accompanied by loop filter control. The same conditions as those of the PLL of FIG. 31 are applied to a PLL of FIG. 32.

The phase deviation of the output signal quickly converges (at around 450 points in time) by the loop filter with a 100-Hz cutoff frequency, as illustrated in FIG. 32. In addition, after 700 points in time, the phase deviation of the output signal is stabilized by the loop filter with a 10-Hz cutoff frequency.

According to one aspect of the disclosed apparatus, it is possible to improve the tracking performance of the output signal to changes in the input signal.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A phase locked loop for generating an output signal whose wavenumber matches a wavenumber of a signal with gaps, input thereto, the phase locked loop comprising:
    a first frequency divider configured to divide a frequency of the input signal;
    a second frequency divider configured to divide a frequency of the output signal; and
    a calculation unit configured to calculate a phase difference between a signal output from the first frequency divider and a signal output from the second frequency divider in one cycle of the output signal of the first frequency divider, and then calculate an average phase difference based on calculated phase differences;
    wherein the calculation unit subtracts the average phase difference from a phase difference in a certain phase.

2. The phase locked loop according to claim 1, wherein the calculation unit includes:
    a count accumulation unit configured to divide the input signal into equally-spaced wavenumber intervals and calculate a first cumulative count value by accumulating count values of a counter, captured at interval boundary points of the equally-spaced wavenumber intervals;
    a phase counter configured to count a phase difference in a certain phase;
    a first subtraction unit configured to subtract, from the first cumulative count value, a second cumulative count value calculated by accumulating count values of the counter, captured at interval boundary points obtained by dividing the input signal into equally-spaced time intervals;
    a division unit configured to divide a resultant value of the subtraction of the first subtraction unit by a number of the interval boundary points of the equally-spaced wavenumber intervals; and
    a second subtraction unit configured to subtract a resultant value of the division of the division unit from the phase difference counted by the phase counter.

3. The phase locked loop according to claim 2, wherein the second cumulative count value is a constant value.

4. The phase locked loop according to claim 1, further comprising:
    a low-pass filter configured to receive a signal output from the calculation unit; and
    an oscillation control circuit configured to vary an oscillation frequency of the output signal based on a signal output from the low-pass filter,
    wherein the output signal output from the oscillation control circuit is input to the second frequency divider.

5. A phase comparison method for a phase locked loop that generates an output signal whose wavenumber matches a wavenumber of a signal with gaps, input thereto, the phase comparison method comprising:
    dividing, by a first frequency divider, a frequency of the input signal;
    dividing, by a second frequency divider, a frequency of the output signal;
    calculating a phase difference between a signal output from the first frequency divider and a signal output from the second frequency divider in one cycle of the output signal of the first frequency divider, and then calculating an average phase difference based on calculated phase differences; and
    subtracting the average phase difference from a phase difference in a certain phase.

* * * * *